United States Patent [19]

Ikeda

[11] Patent Number: 5,395,649

[45] Date of Patent: Mar. 7, 1995

[54] SPIN COATING APPARATUS FOR FILM FORMATION OVER SUBSTRATE

[75] Inventor: Rikio Ikeda, Kanagawa, Japan

[73] Assignee: Sony Corporation, Tokyo, Japan

[21] Appl. No.: 13,023

[22] Filed: Feb. 3, 1993

[30] Foreign Application Priority Data

Feb. 4, 1992 [JP] Japan .................................. 4-017949
Apr. 30, 1992 [JP] Japan .................................. 4-111133
Jun. 29, 1992 [JP] Japan .................................. 4-170322

[51] Int. Cl.[6] .............................................. B05D 3/12
[52] U.S. Cl. .................................... 427/240; 118/50;
118/52; 427/294; 427/377; 427/378; 427/385.5
[58] Field of Search ............. 427/240, 377, 378, 385.5,
427/294; 118/50, 52

[56] References Cited

U.S. PATENT DOCUMENTS

| | | | |
|---|---|---|---|
| 2,580,131 | 12/1951 | Rowell | 427/240 |
| 4,347,302 | 8/1982 | Gotman | 427/240 |
| 4,393,807 | 7/1983 | Fujimura et al. | 427/240 |
| 4,790,262 | 12/1988 | Nakayama et al. | 427/240 |
| 4,889,069 | 12/1989 | Kawakami | 427/240 |

FOREIGN PATENT DOCUMENTS

| | | | |
|---|---|---|---|
| 52-05268 | 1/1977 | Japan | 427/240 |
| 9090928 | 5/1984 | Japan | 427/240 |

OTHER PUBLICATIONS

*I.B.M. Technical Disclosure Bulletin*, vol. 22, No. 5, Oct. 1979.
*I.B.M. Technical Disclosure Bulletin*, vol. 17, No. 11, Apr. 1975.

*Primary Examiner*—Janyce Bell
*Attorney, Agent, or Firm*—Hill, Steadman & Simpson

[57] ABSTRACT

A method and apparatus for rotating a substrate having a liquid material placed thereon to coat the liquid material over the substrate. A plate member is positioned at a predetermined height above the substrate to minimize the growth of the fluid flows produced above the substrate due to rotation of the substrate.

25 Claims, 43 Drawing Sheets

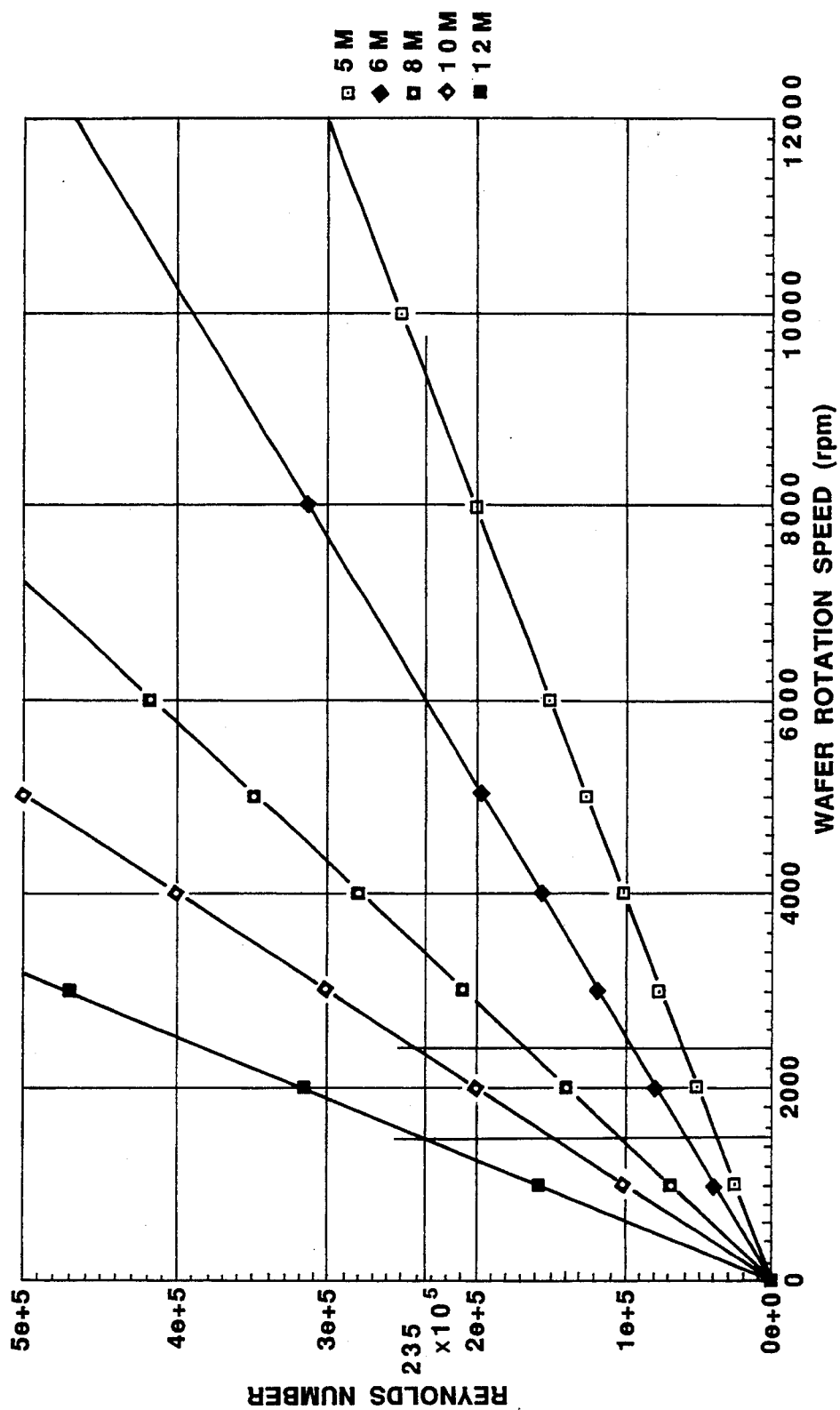

$\lambda = (\omega_0/v)^{1/2}x$ $$\gamma = 0.01 e^{\frac{0.19}{0.5}(-\theta)}$$

$$\gamma' = 0.02 e^{\frac{0.19}{0.5}(-\theta)}$$

$$\gamma'' = 0.03 e^{\frac{0.19}{0.5}(-\theta)}$$

$$\gamma''' = 0.04 e^{\frac{0.19}{0.5}(-\theta)}$$

$$\gamma'''' = 0.05 e^{\frac{0.19}{0.5}(-\theta)}$$

$$\gamma''''' = 0.06 e^{\frac{0.19}{0.5}(-\theta)}$$

$$\gamma'''''' = 0.07 e^{\frac{0.19}{0.5}(-\theta)}$$

$$\gamma''''''' = 0.08 e^{\frac{0.19}{0.5}(-\theta)}$$

$$\gamma'''''''' = 0.09 e^{\frac{0.19}{0.5}(-\theta)}$$

$$\gamma = 0.01e^{\frac{0.19}{1-0.5}(-\theta)}$$

$$\gamma' = 0.02e^{\frac{0.19}{1-0.5}(-\theta)}$$

$$\gamma'' = 0.03e^{\frac{0.19}{1-0.5}(-\theta)}$$

$$\gamma''' = 0.04e^{\frac{0.19}{1-0.5}(-\theta)}$$

$$\gamma'''' = 0.05e^{\frac{0.19}{1-0.5}(-\theta)}$$

$$\gamma''''' = 0.06e^{\frac{0.19}{1-0.5}(-\theta)}$$

$$\gamma'''''' = 0.07e^{\frac{0.19}{1-0.5}(-\theta)}$$

SPIN COATING APPARATUS FOR FILM FORMATION OVER SUBSTRATE

BACKGROUND OF THE INVENTION

1. Field of the Invention

This invention relates to spin coating of a liquid material over a substrate and, more particularly, to a spin coating method and apparatus for minimizing film thickness variations caused by turbulent flows produced with rotation of the substrate.

2. Description of the Prior Art

The accuracy required for pattern forming techniques has been increased to meet recent demands for higher density semiconductor devices. In general, the required accuracy is ±10% of the design rule. For example, an accuracy (pattern line width uniformity) of ±0.035 μm is required for micro LSI having a design rule of 0.35 μm. The factors which may be considered to degrade the pattern forming accuracy include variations in resist film thickness, resist development rate and resist material characteristics made during the photolithography processes, optical or mechanical variations in the exposure unit, variations in photo mask line width, variations in substrate reflection factor, variations in oxide film thickness, etc. In view of these factors causing line width variations, the variance width (Range), which indicates the resist film thickness uniformity, is required to be less than 5 nm (50 Å) for micro LSI having a design-rule of 0.35 μm.

Furthermore, it is required to improve the productivity by using wafers having a larger diameter. The diameter of the wafers used normally in producing micro LSI is as large as 200 mm (8 inches). However, it becomes more difficult to assure the uniformity of the resist film as the wafer has a larger diameter. This is described further in connection with FIGS. 1A to 1C. A wafer 1 is retained in a horizontal position by means of a wafer chuck 2. A resist is discharged from a resist nozzle 3 onto the wafer 1, as shown in FIG. 1A. Then, the wafer 1 is rotated, as shown in FIG. 1B, to form a resist film thereon, as shown in FIG. 1C. The wafer 1 is rotated normally at a speed ranging from 3000 rpm to 6000 rpm. The thickness of the resist film is dependent on the speed and time of rotation of the wafer 1. The speed of rotation of the wafer 1 has an effect on the uniformity of the resist film thickness. The uniformity of the resist film thickness increases with increasing speed of rotation of the wafer 1. Assuming now that the wafer has a diameter of 125 mm (5 inches), the produced resist film will have a sufficient thickness uniformity if the wafer 1 is rotated at a speed higher than 4000 rpm during the resist spin coating process.

One serious problem associated with the conventional spin coating method is the tendency of turbulent air flows to occur near the resist film coated on the rotating wafer 1. The turbulent air flows cause partial variations in the quantity of evaporation of the resist to degrade the uniformity of the resist film thickness. This tendency increases as the wafer rotation speed increases and, thus, the wafer circumferential speed increases. For example, it was said that variations in the resist film thickness occur near the periphery of the wafer 1 due to turbulent air flows when a wafer 1 having a diameter of 200 mm (8 inches) is rotated at a speed higher than 4000 rpm. According to the result of the tests conducted by the inventor, it is ensured that a good resist film thickness uniformity can be obtained when the wafer 1 is rotated at a speed less than 3500 rpm. When the wafer 1 is rotated at a speed of 4000 rpm, the resist film thickness 100 varies in a range of 100 nm (1000 Å) in a zone 101 between the periphery of the wafer and 7 mm inside the periphery of the wafer, as shown in FIGS. 2A and 2B. In this case, the Reynolds number is $2.35 \times 10^5$. The resist coating cannot be made with the Reynolds number exceeding $2.35 \times 10^5$. As can be seen from FIG. 3, the speed of rotation of the wafer cannot be increased over 3500 rpm for 8 inch wafers. The upper limit of the wafer rotation speed decreases as the diameter of the wafer increases. For example, the maximum possible wafer rotation speed is 2400 rpm for 10 inch wafers and 1500 rpm for 12 inch wafers. It may be considered to achieve a good resist film thickness uniformity at a low speed of rotation of the wafer by decreasing the resist viscosity. However, this is sensitive to ambient temperature and humidity. Accordingly, the need has been recognized for a practical approach which can form a resist film having a sufficient thickness uniformity over a wafer having a large diameter.

SUMMARY OF THE INVENTION

It is a main object of the invention to provide an improved spin coating method and apparatus which can coat a liquid material to form a film on a substrate with superior film thickness uniformity over the entire surface area of the substrate.

Another object of the invention is to provide an improved spin coating method and apparatus which can provide a desired film thickness over a wide range.

There is provided, in accordance with the invention, a spin coating method for rotating a substrate having a liquid material placed thereon to coat the liquid material over the substrate. The method comprises the steps of supporting the substrate, dropping the liquid material on the substrate, and rotating the substrate about an axis extending through the center of the substrate with a plate member positioned at a predetermined height above the substrate to minimize the growth of the fluid flows produced above the substrate due to rotation of the substrate.

In another aspect of the invention, there is provided a spin coating apparatus for rotating a substrate having a liquid material placed thereon to coat the liquid material over the substrate. The apparatus comprises means for supporting the substrate and rotating the substrate about an axis extending through the center of the substrate, a nozzle for dropping the liquid material onto the substrate, and a plate member positioned at a predetermined height above the substrate to minimize the growth of the fluid flows produced above the substrate due to rotation of the substrate.

In another aspect of the invention, there is provided a spin coating method for rotating a substrate having a liquid material placed thereon to coat the liquid material over the substrate. The method comprises the steps of supporting the substrate, dropping the liquid material on the substrate, and rotating the substrate about an axis extending through the center of the substrate with a plate member positioned at a predetermined height above the substrate to minimize the growth of the fluid flows produced above the substrate due to rotation of the substrate. The plate member is formed in its surface facing to the substrate with a number of grooves for introduction of the fluid flows.

In another aspect of the invention, there is provided a spin coating apparatus for rotating a substrate having a liquid material placed thereon to coat the liquid material over the substrate. The apparatus comprises means for supporting the substrate, means for dropping the liquid material on the substrate, means for rotating the substrate about an axis extending through the center of the substrate, and a plate member positioned at a predetermined height above the substrate to minimize the growth of the fluid flows produced above the substrate due to rotation of the substrate. The plate member is formed in its surface facing to the substrate with a number of grooves for introduction of the fluid flows.

In another aspect of the invention, there is provided a spin coating method for rotating a substrate having a liquid material placed thereon to coat the liquid material over the substrate. The method comprises the steps of supporting the substrate, dropping the liquid material on the substrate, providing an atmosphere of a gas in which spin coating is to be performed, and rotating the substrate about an axis extending through the center of the substrate with a plate member positioned at a predetermined height above the substrate to minimize the growth of the fluid flows produced above the substrate due to rotation of the substrate. The gas has a kinematic viscosity coefficient $v1$ defined as:

$$v1 \geq r^2 \cdot w / 2.35 \times 10^{-5}$$

where r is the radius of the substrate and w is the angular velocity of the substrate.

In another aspect of the invention, there is provided a spin coating apparatus for rotating a substrate having a liquid material placed thereon to coat the liquid material over the substrate. The apparatus comprises means for supporting the substrate and rotating the substrate about an axis extending through the center of the substrate, a nozzle for dropping the liquid material onto the substrate, a plate member positioned at a predetermined height above the substrate to minimize the growth of the fluid flows produced above the substrate due to rotation of the substrate, a chamber for containing the substrate, means for charging the chamber with a gas.

In another aspect of the invention, there is provided, a spin coating method for rotating a substrate having a liquid material placed thereon to coat the liquid material over the substrate. The method comprises the steps of supporting the substrate, dropping the liquid material on the substrate, controlling the pressure of the atmosphere of the substrate to a predetermined value P, and rotating the substrate about an axis extending through the center of the substrate with a plate member positioned at a predetermined height above the substrate to minimize the growth of the fluid flows produced above the substrate due to rotation of the substrate. The predetermined pressure P is in the following range:

$$P(mmHg) \leq 2.50 \times 10^3 \times (1 + 0.00367t)/r^2 w$$

where r is the radius of the substrate and w is the angular velocity of the substrate.

In the another aspect of the invention, there is provided a spin coating apparatus for rotating a substrate having a liquid material placed thereon to coat the liquid material over the substrate. The apparatus comprises means for supporting the substrate and rotating the substrate about an axis extending through the center of the substrate, a nozzle for dropping the liquid material onto the substrate, a plate member positioned at a predetermined height above the substrate to minimize the growth of the fluid flows produced above the substrate due to rotation of the substrate, a chamber for containing the substrate, and means for decreasing the pressure in the chamber to a predetermined value.

In another aspect of the invention, there is provided a spin coating method for rotating a substrate having a liquid material placed thereon to coat the liquid material over the substrate. The method comprises the steps of supporting the substrate, dropping the liquid material on the substrate, controlling the temperature of the atmosphere of the substrate to a predetermined value t1, and rotating the substrate about an axis extending through the center of the substrate with a plate member positioned at a predetermined height above the substrate to minimize the growth of the fluid flows produced above the substrate due to rotation of the substrate. The predetermined temperature t1 is defined as:

$$t1\ (°C.) \geq \sqrt{1800 + 30000 r^2 w} - 314.2$$

where r is the radius of the substrate and w is the angular velocity of the substrate.

In another aspect of the invention, there is provided a spin coating apparatus for rotating a substrate having a liquid material placed thereon to coat the liquid material over the substrate. The apparatus comprises means for supporting the substrate and rotating the substrate about an axis extending through the center of the substrate, a nozzle for dropping the liquid material onto the substrate, a plate member positioned at a predetermined height above the substrate to minimize the growth of the fluid flows produced above the substrate due to rotation of the substrate, a chamber for containing the substrate, means for introducing a heated gas into the chamber to control the temperature of the chamber to a predetermined value.

BRIEF DESCRIPTION OF THE DRAWINGS

This invention will be described in greater detail by reference to the following description taken in connection with the accompanying drawings, in which:

FIG. 3 is a graph of Reynolds number versus wafer rotation speed;

DETAILED DESCRIPTION OF THE PREFERRED EMBODIMENTS

Figure 1A:
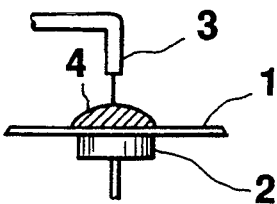
FIGS. 1A, 1B and 1C are schematic diagram used in explaining the conventional spin coating method.
Figure 1B:
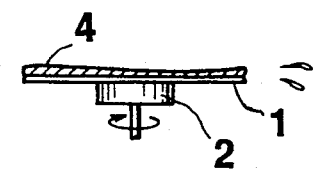
Figure 1C:
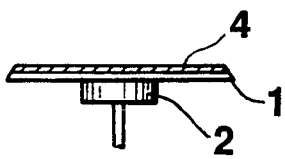
Figure 2A:
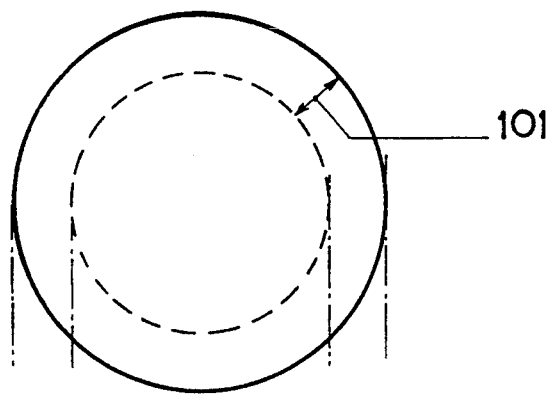
FIG. 2A is a plan view of a wafer.
Figure 2B:
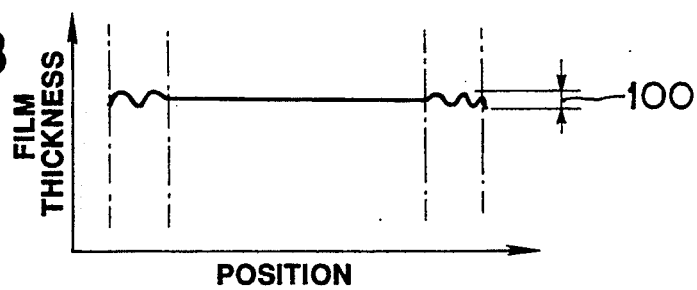
FIG. 2B is a diagram used in explaining film thickness variations produced in the conventional spin coating method.
Figure 4:
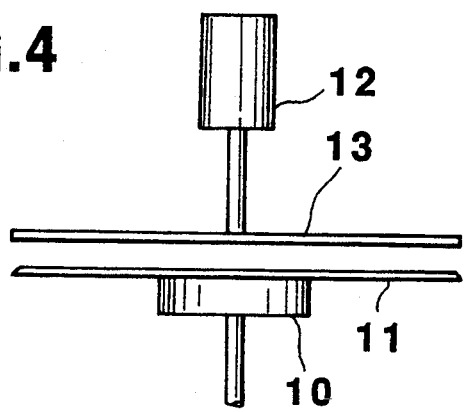
FIG. 4 is an elevational view showing one embodiment of a spin coating apparatus made in accordance with the invention.
Figure 5:
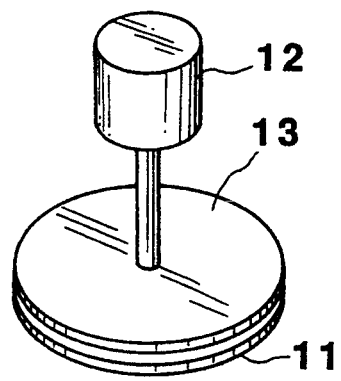
FIG. 5 is a perspective view of the spin coating apparatus of FIG. 4.

Referring to FIGS. 4 and 5, there is shown a spin coating apparatus embodying the method and apparatus of the invention. A wafer 11 is retained in a horizontal position by means of a wafer chuck 10. A disc plate 13 is secured at its center to the output shaft of an electric motor 12 so that it is positioned over the wafer 11 in spaced-parallel relationship with the wafer 11.

In order to provide a basis for a better understanding of the invention, description will be made to the principles of the invention. The plate member (disc plate 13) should be positioned in place with respect to the substrate (wafer 11) so as to suppress the turbulent air flows to a sufficient extent. The flow rate distribution produced when the substrate is rotating is calculated in the following manner: The Navier-Stokes equation, which defines viscosity and density changes, can be simplified when the viscosity is constant. In a cylindrical coordinate system, the Navier-Stokes equation is simplified as:

$$\rho\left(\frac{DU_r}{Dt} - \frac{U\phi^2}{r}\right) = -g\rho\frac{\partial h}{\partial r} - \frac{\partial P}{\partial r} + \quad (1)$$

$$\eta\left(\nabla^2 U_r - \frac{U_r}{r^2} - \frac{2}{r^2}\frac{\partial U\phi}{\partial \phi}\right) + \left(K + \frac{1}{3}\eta\right)\frac{\partial}{\partial r}\nabla\cdot U$$

$$\rho\left(\frac{DU\phi}{Dt} + \frac{U_rU\phi}{r}\right) = -g\rho\frac{1}{r}\frac{\partial h}{\partial \phi} - \frac{1}{r}\frac{\partial P}{\partial \phi} + \quad (2)$$

$$\eta\left(\nabla^2 U\phi - \frac{U\phi}{r^2} + \frac{2}{r^2}\frac{\partial U_r}{\partial \phi}\right) + \left(K + \frac{1}{3}\eta\right)\frac{\partial}{\partial \phi}\nabla\cdot U$$

$$\rho\frac{DU_x}{Dt} = -g\rho\frac{\partial h}{\partial x} - \frac{\partial P}{\partial x} + \quad (3)$$

$$\eta\nabla^2\cdot U_x + \left(K + \frac{1}{3}\eta\right)\frac{\partial}{\partial x}\nabla\cdot U$$

where $U_r$, $U\Phi$ and $U_x$ are the velocities of the fluid (for example, air) in the r, $\Phi$ and x directions, t is the time during which the substrate is rotated, $\rho$ is the density of the fluid, g is the gravitational acceleration, h is the height with respect to the substrate, P is the pressure, $\eta$ is the viscosity of the material to be coated over the substrate, K is the volume viscosity of the material, and D/Dt is the Lagrangian operator given as:

$$\frac{D}{Dt} = U_r\frac{\partial}{\partial r} + U\phi\frac{\partial}{\partial \phi} + U_x\frac{\partial}{\partial x} + \frac{\partial}{\partial t}$$

It is now assumed that the substrate is rotating about an axis normal to its surface at a constant angular velocity $\omega_0$. Rotation of the substrate causes the fluid to rotate. The fluid move outward due to the centrifugal force acting thereon. Since the air flow on the rotating wafer are symmetrical with respect to the axis of rotation of the substrate, $\delta/\delta\Phi = 0$ in Equations (1), (2) and (3). Under stationary and in compressed conditions, $\delta u/\delta t = 0$ and $\nabla U$ is constant. Thus, Equations (1), (2) and (3) may be rewritten as $$\rho\left(U_r\frac{\partial U_r}{\partial r} + U_x\frac{\partial U_x}{\partial x} - \frac{U\phi^2}{r}\right) = \quad (4)$$

$$-\frac{\partial P'}{\partial r} + \eta\left[\frac{1}{r}\frac{\partial}{\partial r}\left(r\frac{\partial U_r}{\partial r}\right) + \frac{\partial^2 U_r}{\partial x^2} - \frac{U_r}{r^2}\right]$$

$$\rho\left(U_r\frac{\partial U\phi}{\partial r} + U_x\frac{\partial U\phi}{\partial x} + \frac{U_rU\phi}{r}\right) = \quad (5)$$

$$\eta\left[\frac{1}{r}\frac{\partial}{\partial r}\left(r\frac{\partial U\phi}{\partial r}\right) + \frac{\partial^2 U\phi}{\partial x^2} - \frac{U\phi}{r^2}\right]$$

$$\rho\left(U_r\frac{\partial U_x}{\partial r} + U_x\frac{\partial U_x}{\partial x}\right) = -\frac{\partial P'}{\partial x} + \quad (6)$$

$$\eta\left[\frac{1}{r}\frac{\partial}{\partial r}\left(r\frac{\partial U_x}{\partial r}\right) + \frac{\partial^2 U_x}{\partial x^2}\right]$$

where P' is the potential given as $P' = P + g\rho h$.

In a cylindrical coordinate system, the continuous Equation (Mass Conservation Law) is given as:

$$\frac{D\sigma}{Dt} + \sigma\left[\frac{1}{r}\frac{\partial(rU_r)}{\partial r} + \frac{1}{r}\frac{\partial U\phi}{\partial \phi} + \frac{\partial U_x}{\partial x}\right] = 0$$

where $\sigma$ is the specific gravity.

Under the same conditions as described in connection with Equations (4), (5) and (6), the continuous Equation is given as:

$$\frac{1}{r}\frac{\partial(rU_r)}{\partial r} + \frac{\partial U_x}{\partial x} = 0 \quad (7)$$

If the origin is positioned on the wafer surface, the boundary condition will be given as follows:

When x=0, Ux=0, Ur=0 and U$\Phi$=r$\omega_0$
When x=$\infty$, Ur=0 and U$\Phi$=0

On an assumption that $U_r/r$, $U\Phi/r$, $U_x$ and P' are defined as a function of x only, Von Karman simplified Equation (4) through (7) in the following manner:

A new variable $\lambda$ is defined as:

$$\lambda = (\omega_0/\upsilon)^{\frac{1}{2}}X$$

where $\upsilon$ is the kinematic viscosity coefficient of the atmosphere in which the material is coated. The parameters $U_r$, $U\Phi$, $U_x$ and P' are assumed as follows:

$$U_r = \omega_0 r F(\lambda)$$

$$U\Phi = \omega_0 r G(\lambda)$$

$$U_x = (\upsilon\omega_0)^{\frac{1}{2}} H(\lambda)$$

$$P' = \eta\omega_0 K(\lambda)$$

Differentiating these equations yields $$\frac{\partial U_r}{\partial r} = \omega_0 F(\lambda)$$

-continued $$\frac{\partial Ur}{\partial x} = \omega_0 r \left(\frac{\omega_0}{\nu}\right)^{\frac{1}{2}} F, \frac{\partial^2 Ur}{\partial x^2} = \left(\frac{\omega_0^2 r}{\nu}\right) F''$$

$$\frac{\partial U\phi}{\partial r} = \omega_0 G(\lambda)$$

$$\frac{\partial U\phi}{\partial x} = \omega_0 r \left(\frac{\omega_0}{\nu}\right)^{\frac{1}{2}} G', \frac{\partial^2 U\phi}{\partial x^2} = \left(\frac{\omega_0^2 r}{\nu}\right) G''$$

$$\frac{\partial Ux}{\partial r} = 0$$

$$\frac{\partial Ux}{\partial x} = \omega_0 H', \frac{\partial^2 Ux}{\partial x^2} = \omega_0 \left(\frac{\omega_0}{\nu}\right)^{\frac{1}{2}} H''$$

$$\frac{\partial P}{\partial r} = 0$$

$$\frac{\partial P}{\partial x} = \eta \omega_0 \left(\frac{\omega_0}{\nu}\right)^{\frac{1}{2}} K'$$

Substituting these equations into Equations (4) through (7) gives $$F^2 + HF' - G^2 - F'' = 0 \quad (8)$$

$$2FG + HG' - G'' = 0 \quad (9)$$

$$HH' + K' - H'' = 0 \quad (10)$$

$$2F + H' = 0 \quad (11)$$

In Equations (8) through (11), the boundary conditions are $$H(0)=0, F(0)=0, G(0)=1$$

$$F(\infty)=0, G(\infty)=0, K(\infty)=0$$

Integrating Equation (10) gives $$K = -[2F+(\tfrac{1}{2})H^2]$$

Figure 6:
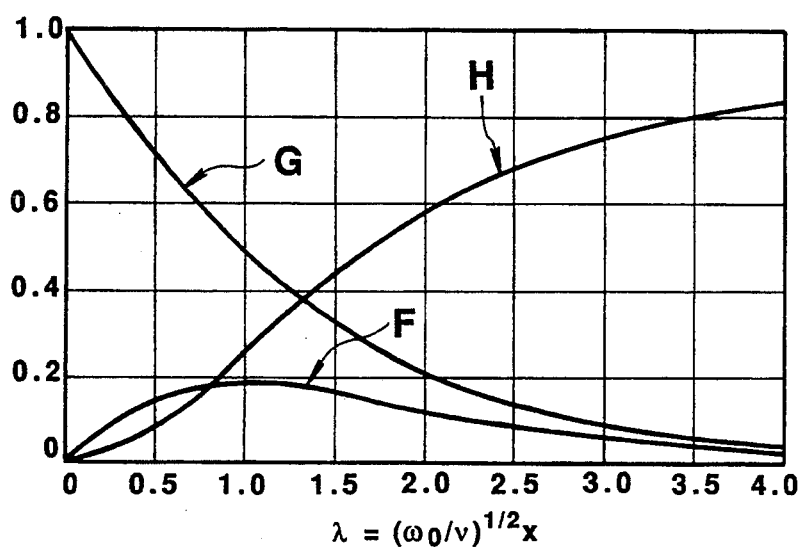
FIG. 6 is a graph showing velocity distributions for different directions.
Figure 7:
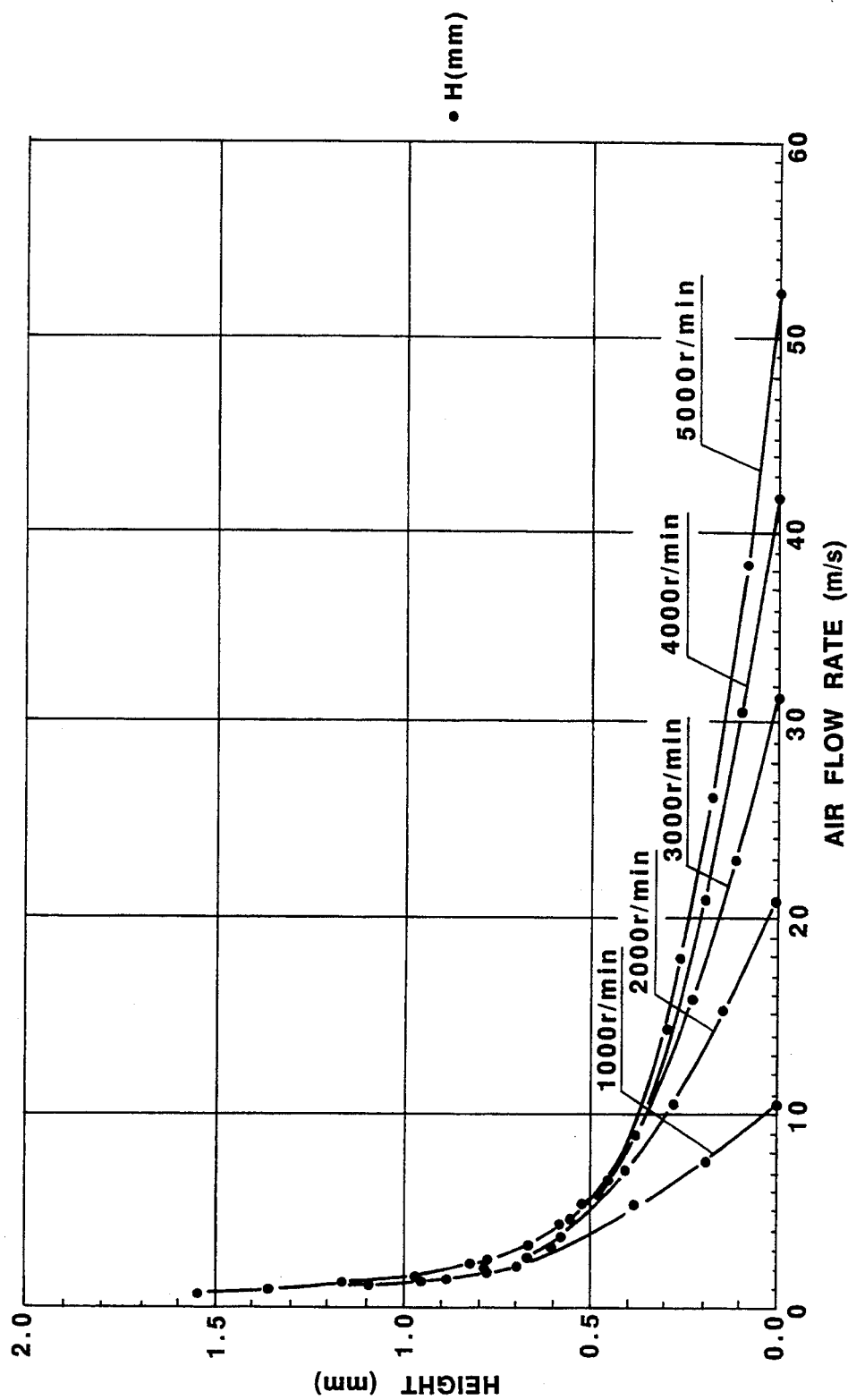
FIG. 7 is a graph of height versus air flow rate.
Figure 8:
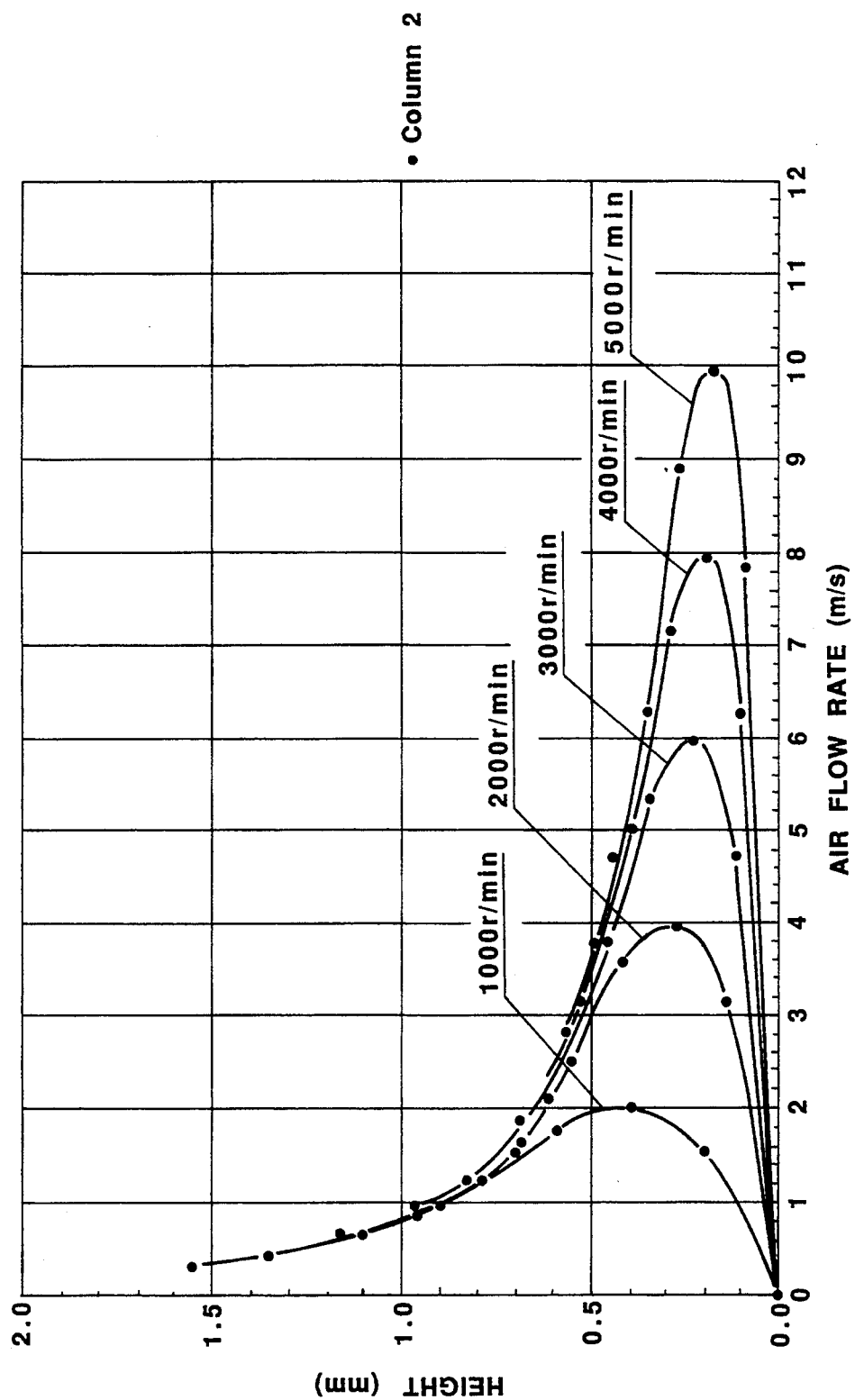
FIG. 8 is a graph of height versus air flow rate.

Cochran utilizes series expansion to solve Equations (8), (9) and (11). The results are shown in FIG. 6. The factor F is the velocity distribution in the direction of the radius r of the wafer, the factor G is the velocity distribution in the direction of the periphery Φ of the wafer and the factor H is the velocity distribution in the direction of the height x with respect to the wafer. Thus, the factors G, H and F can be obtained from λ which is calculated as a function of the substrate angular velocity $\omega_0$, the kinetic viscosity coefficient υ and the height x above the wafer. The velocities Ur, UΦ and Ux of the fluid (for example, air) can be obtained by substituting the factors G, H and F into the equations (8) through (11). The fluid velocity distributions calculated in such a manner are shown in FIGS. 7 and 8. FIG. 7 relates to the fluid velocities in the direction of the periphery of a wafer having an 8 inch diameter. The fluid held in contact with the wafer moves at the same velocity as the wafer. The fluid velocity decreases at a high rate as going away from the wafer. The fluid velocity is almost zero at a height of 1 mm above the wafer. FIG. 8 relates to the fluid velocities in the direction of the radius of the wafer. The fluid is accelerated due to the centrifugal force acting thereon. The fluid velocity is at maximum at a height of 0.2 mm above the wafer and is almost zero at a height of 1 mm above the wafer. As can be seen from FIGS. 7 and 8, the turbulent flows occur in a height less than 1 mm above the wafer.

Figure 9:
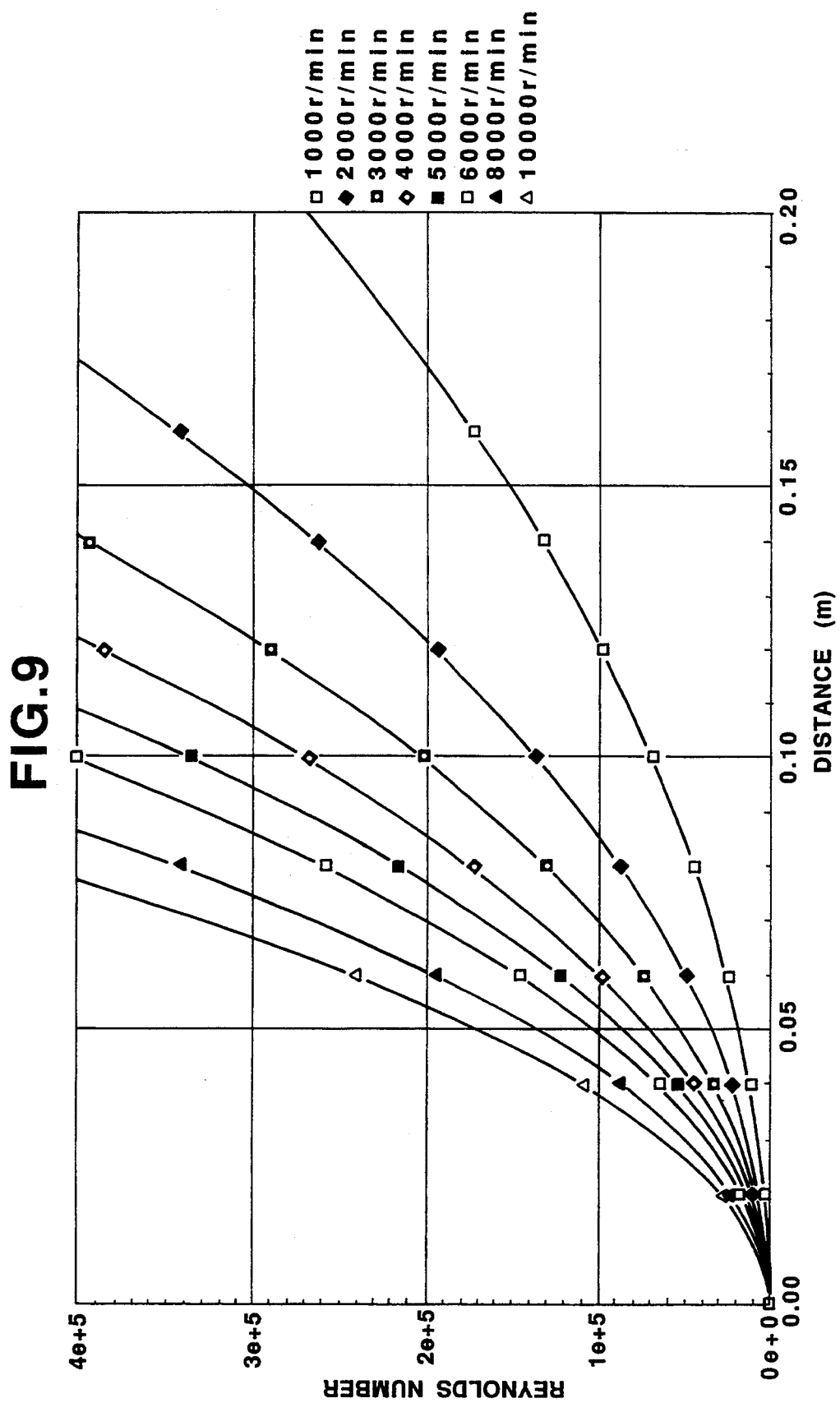
FIG. 9 is a graph of Reynolds number versus distance.

FIG. 9 is a graph showing the Reynolds number as a function of the distance from the center of the wafer. It was found that the plate member should be provided at a position where the Reynolds number is equal to or greater than $2.35 \times 10^5$. The turbulent flows are produced when the fluid velocity distribution has a great inclination. It is desirable to reduce the inclination by rotating the plate member provided above the wafer in the same direction as the wafer so as to produce air flows. If the direction of rotation of the plate member is the same as the direction of rotation of the wafer, the inclination of the fluid velocity distribution will be reduced to suppress the turbulent flows.

EXAMPLE 1

The disc plate 13 was positioned at a distance of 0.5 mm above an 8 inch wafer 11. The disc plate 13 was rotated in the same direction as the wafer 11 and at the same speed as the wafer 11. No turbulent flow occurred even when the wafer 11 was rotated at a speed higher than 4000 rpm. The variance width (Range), which indicates the degree of the film thickness uniformity, was 4.0 nm (40 Å).

EXAMPLE 2

The disc plate 13 was positioned at a distance of 0.5 mm above an 8 inch wafer 11. The disc plate 13 was rotated in the same direction as the wafer 11 and at a speed less than the wafer 11. The speed of rotation of the disc plate 13 was selected in a range defined as:

$$|\omega_1 - \omega_2| = (\nu/r_0^2) \times 2.15 \times 10^5$$

The wafer 11 was rotated at a speed of 6000 rpm, whereas the disc plate 13 was rotated at a speed of 2610 rpm. The variance width (Range) was 4.0 mn. The speed of rotation of the disc plate was calculated on an assumption that the kinematic coefficient υ of viscosity of the air was $1.57 \times 10^{-5}$ m²/s.

Figure 10:
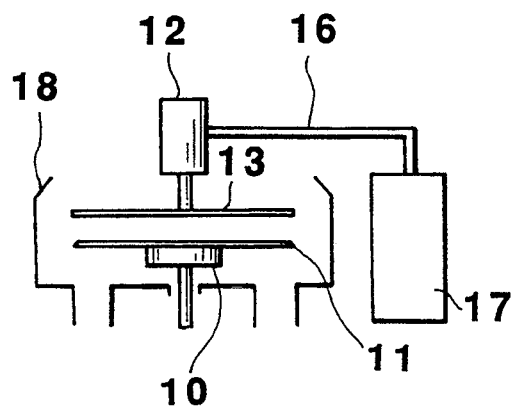
FIG. 10 is a schematic diagram showing a modified form of the spin coating apparatus of the invention.

Referring to FIG. 10, there is shown a modified form of the spin coating apparatus of the invention. In this modification, A wafer 11 is retained in a horizontal position by means of a wafer chuck 10. A disc plate 13 is secured at its center to the output shaft of an electric motor 12 so that it is positioned over the wafer 11 in spaced-parallel relationship with the wafer 11. The electric motor 12 is connected through an arm 16 to a drive unit 17 which moves the electric motor 12 between two positions. In the first position, the disc plate 13 is held in alignment with the wafer 11. After the spin coating operation is completed, a command is produced to cause the drive unit 17 to move the disc plate 13 from the first position to the second position for waiting. This is effective to prevent the air to stay for a long time over the wafer 11. The wafer 11 and the disc plate 13 are contained in a cup-shaped vessel 18 for recovery of the excessive resist splashed from the rotating wafer 11.

Figure 11A:
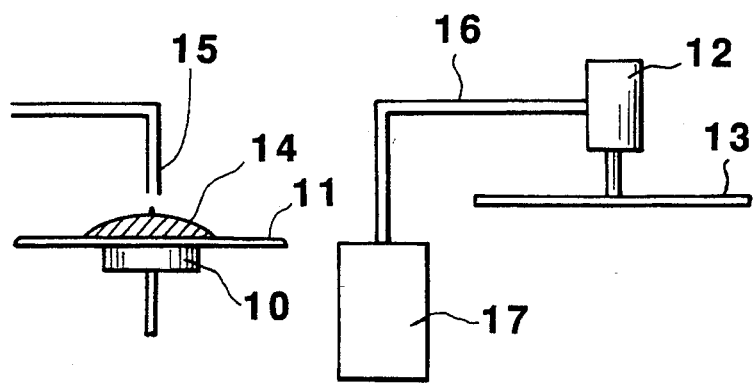
FIGS. 11A, 11B and 11C are schematic diagrams used in explaining the spin coating method using the spin coating apparatus of FIG. 10.
Figure 11B:
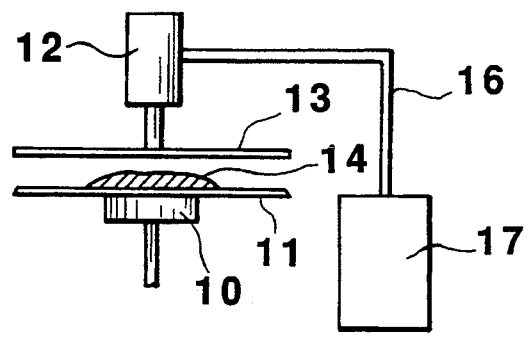
Figure 11C:
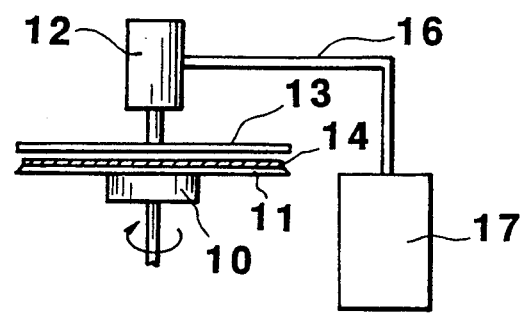

The spin coating operation is started with discharge of a resist 14 from a resist nozzle 15 onto the wafer 11 retained in a horizontal position on the wafer chuck 10, as shown in FIG. 11A. In this case, the disc plate 13 is held in its second position away from the wafer 11. After a predetermined quantity of resist is discharged through the resist nozzle 15, a command is produced to cause the drive unit 17 to move the disc plate 13 along with the electric motor 12 from the second position to the first position, as shown in FIG. 11B. The electric motor 12 operates to rotate the disc plate 13 at the same time when the wafer 11 is rotated. When a predetermined time (spin coating time) t has been elapsed after the wafer 11 is rotated, a command is produced to stop the wafer 11 and the disc plate 13. Upon completion of one cycle of the spin coating operation, the disc member 13 is moved from the first position, as shown in FIG. 11C, to the second position, as shown in FIG. 11A.

EXAMPLE 3

The diameter of the wafer 11 was 8 inches. In the first position (FIG. 11B), the distance of the disc plate 13 from the wafer 11 was less than 1 mm. No turbulent flow occurred even when the wafer 11 was rotated at a speed of 4000 rpm. The variance width (Range) was 3.5 nm.

EXAMPLE 4

Figure 12:
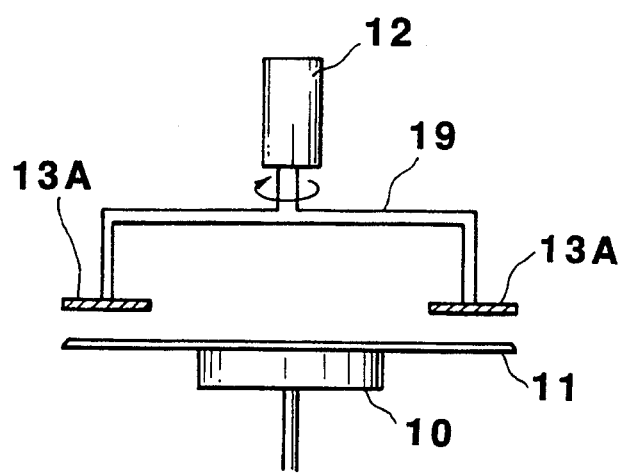
FIG. 12 is a schematic diagram showing a modified form of the spin coating apparatus of the invention.
Figure 13:
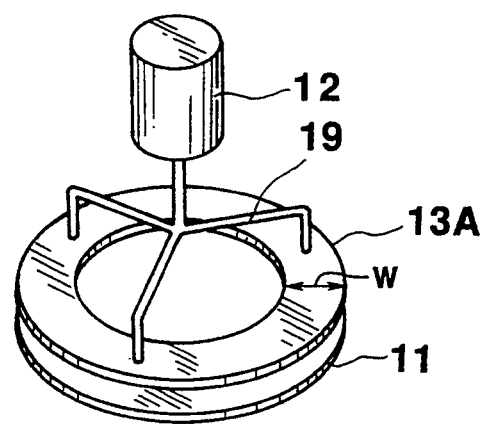
FIG. 13 is a perspective view of the spin coating apparatus of FIG. 12.

As can be seen from Example 3, it is preferable that the disc plate 13 has a shape capable of preventing the air from staying for a long time over the wafer 11. Furthermore, the turbulent flows occur in a range where the Reynolds number is equal to or greater than $2.35 \times 10^5$. In this example, therefore, the disc plate 13A has an annular or ring shape as shown in FIGS. 12 and 13. The electric motor 12 has its output shaft connected mechanically through a support frame member 19 coaxially to the disc plate 13A. The distance r of the disc plate 13A from the center of the wafer 11 is determined as:

$$r = \sqrt{(Re \times v/\omega)}$$

where Re is the Reynolds number equal to $2.35 \times 10^5$ and $v$ is the kinematic viscosity coefficient equal to $1.57 \times 10^{-5}$ m²/s. The width W of the annular disc plate 13A is determined as:

$$W = r_0 - \sqrt{(Re \times v/\omega)}$$

For example, the used annular disc plate 13A has a width of 25 mm covering an 8 inch wafer in a range of 75 mm to 100 mm from its center. The wafer was rotated at 6000 rpm. The variance width was 3.5 nm.

EXAMPLE 5

Preferably, the annular disc plate 13A has a width as short as possible. Thus, the width of the annular disc plate 13A is controlled to the minimum possible value. For example, the annular disc plate 13A may be taken in the form of such an aperture diaphragm as used in a camera. The width W of the annular disc plate 13A was controlled as a function of the speed of rotation of the wafer 11. That is, the width W was calculated as:

$$W = r_0 - \sqrt{(Re \times v/\omega_1)}$$

EXAMPLE 6

It was found that the annular disc plate 13A should be positioned at a height of 1 mm or less above the wafer 11. It was also found that the annular disc plate 13A should be placed in a position where the Reynolds number is $2.35 \times 10^5$ or more. The distance r of the annular disc plate 13A from the center of the wafer 11 can be calculated as:

$$r = \sqrt{(Re \times v/\omega)}$$

where Re is the Reynolds number equal to $2.35 \times 10^5$ and $v$ is the kinematic viscosity coefficient equal to $1.57 \times 10^{-5}$ m²/s. The width W of the annular disc plate 13A can be calculated as:

$$W = r_0 - \sqrt{(Re \times v/\omega)}$$

Figure 14:
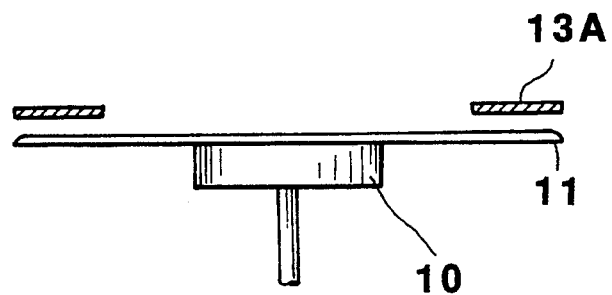
FIG. 14 is a schematic diagram of a modified form of the spin coating apparatus of the invention.
Figure 15:
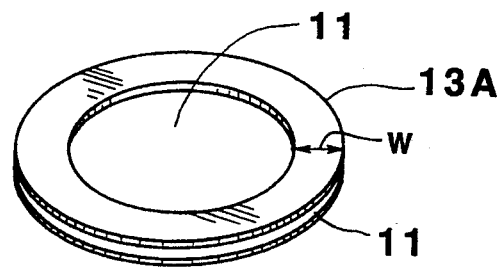
FIG. 15 is a perspective view of the spin coating apparatus of FIG. 14.

As shown in FIGS. 14 and 15, the annular disc plate 13A was positioned above an 8 inch wafer 11. In greater detail, the wafer 11 was rotated at a speed of 5000 rpm. The annular disc plate 13A was positioned at a distance ranging from 83 mm to 100 mm from the center of the wafer 11 and at a height of 0.5 mm above the wafer 11. The width W of the annular disc plate 13A was 17 mm. The variance width (Range) was 4 nm (40 Å).

EXAMPLE 7

The diameter of the used wafer 11 was 12 inches. The annular disc plate 13A was positioned at a distance ranging from 83 mm to 150 mm from the center of the wafer 11 and at a height of 0.5 mm above the wafer 11. The width W of the annular disc plate 13A was 67 min. No film thickness variation was found even when the wafer 11 was rotated at a speed of 5000 rpm. The variance width (Range) was 4 nm (40 Å). Without the use of the annular disc plate 13A, the variance width was 8 nm (80 Å) since the wafer rotation speed cannot be increased over 1600 rpm.

EXAMPLE 8

The diameter of the used wafer 11 was 8 inches. The annular disc plate 13A was positioned at a distance ranging from 65 mm to 100 mm from the center of the wafer 11 and at a height of 0.5 mm above the wafer 11. The width W of the annular disc plate 13A was 35 mm. No film thickness variation was found even when the wafer 11 was rotated at a speed of 8000 rpm. The variance width (Range) was 3.5 nm (45 Å).

EXAMPLE 9

Figure 16:
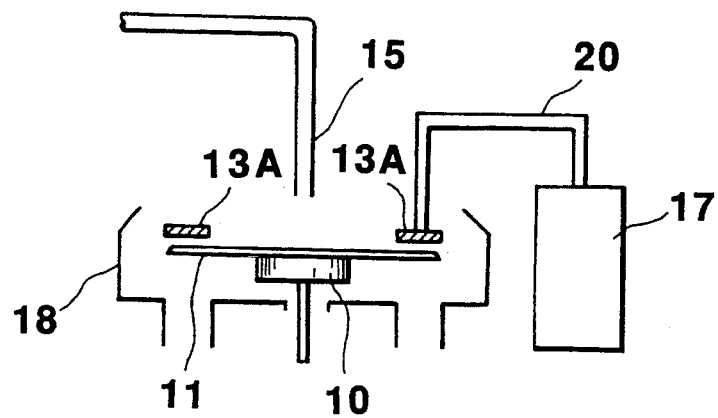
FIG. 16 is schematic diagram showing a modified form of the spin coating apparatus of the invention.

The resist is coated in an atmosphere of controlled temperature and humidity. It is, therefore, it is preferable that the zone where the air stays for a long time is as little as possible. For this reason, the spin coating apparatus was modified as shown in FIG. 16 A wafer 11 is retained in a horizontal position by means of a wafer chuck 10. An annular disc plate 13A is supported by an arm 20 so that it is positioned over the wafer 11 in spaced-parallel relationship with the wafer 11. The arm 20 is connected to a drive unit 17 which moves the annular disc plate 13A between two positions. In the first position, the annular disc plate 13A is held in alignment with the wafer 11. After the spin coating operation is completed, a command is produced to cause the drive unit 17 to move the annular disc plate 13A from the first position to the second position for waiting. The wafer 11 and the annular disc plate 13A are contained in a cup-shaped vessel 18 for recovery of the excessive resist splashed from the rotating wafer 11.

Figure 17A:
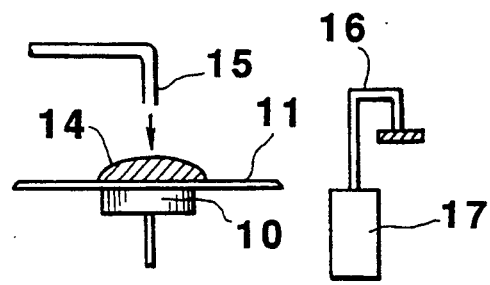
FIGS. 17A, 17B and 17C are schematic diagrams used in explaining the spin coating method using the spin coating apparatus of FIG. 16.
Figure 17B:
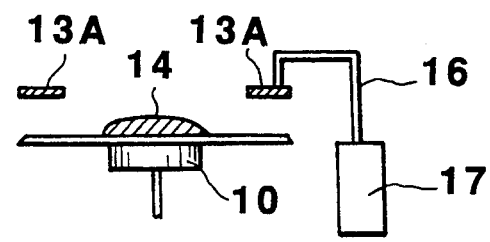
Figure 17C:
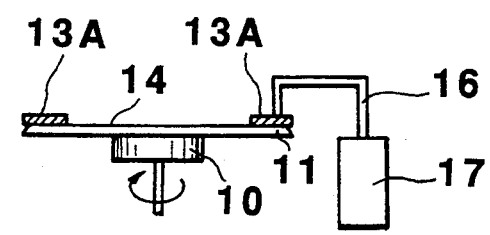

The spin coating operation is s tarred with discharge of a resist 14 from a resist nozzle 15 onto the wafer 11 retained in a horizontal position on the wafer chuck 10, as shown in FIG. 17A. In this case, the disc plate 13 is held in its second position away from the wafer 11. After a predetermined quantity of resist is discharged through the resist nozzle 15, a command is produced to cause the drive unit 17 to move the annular disc plate 13A from the second position to the first position, as shown in FIG. 17B. Before or at the same time when the wafer 11 starts rotating, the annular disc plate 13A moves downward to a height of 0.5 mm above the wafer 11 to suppress the turbulent flows, as shown in FIG. 17C. When a predetermined time (spin coating time) t has been elapsed after the wafer 11 is rotated, a command is produced to stop the wafer 11. Upon completion of one cycle of the spin coating operation, the annular disc member 13A is moved from the first position, as shown in FIG. 17C, to the second position, as shown in FIG. 17A. The variance width (Range) was 4.0 nm (40 Å).

Example 10

Preferably, the width W of the annular disc plate 13A is as short as possible. The distance r of the annular disc plate 13A from the center of the wafer 11 is determined by the speed of rotation of the wafer 11. That is, the distance r is calculated as:

$$r = \sqrt{(Re \times v/\omega)}$$

Figure 18:
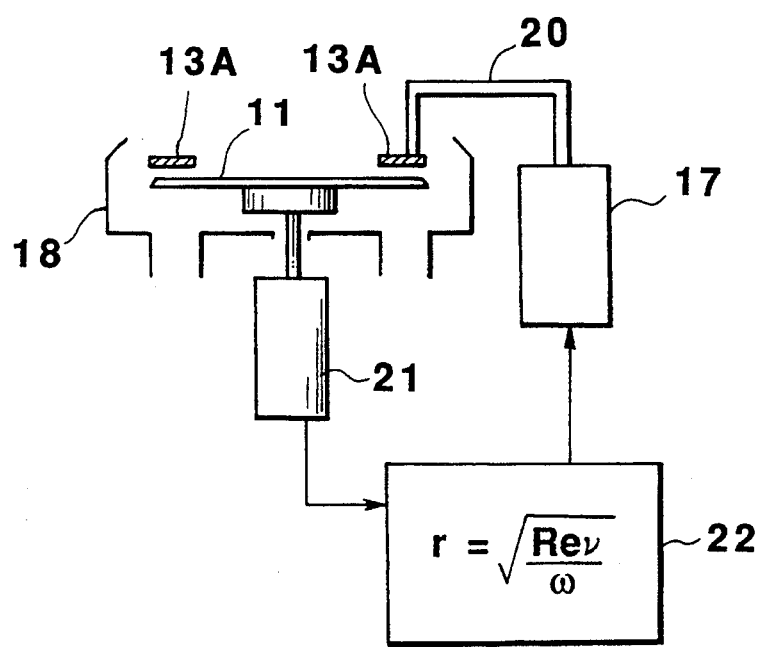
FIG. 18 is a schematic diagram showing a modified form of the spin coating apparatus of the invention.

In this example, the width W of the annular disc plate 13A is controlled to its minimum possible value based upon the speed of rotation of the wafer 11. For this purpose, the spin coating apparatus is modified as shown in FIG. 18. In this case, the annular disc plate 13A is arranged to have a variable width. For example, the annular disc plate 13A may be taken in the form of such an aperture diaphragm as used in a camera. A width control unit 22 detects the speed (angular velocity $\omega$) of rotation of the motor 21 used to rotate the wafer 11 and calculates the minimum possible width of the annular disc plate 13A from the above equation. The width control unit 22 produces a command causing a ring width drive means to control the width of the annular disc plate 13A based upon the calculated minimum possible width. The variance width (Range) was 4.0 nm (40 Å).

EXAMPLE 11

Figure 19:
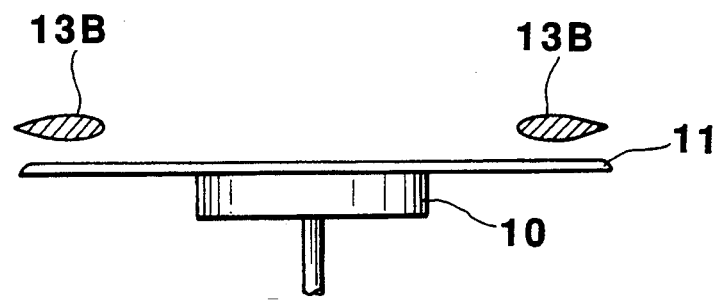
FIG. 19 is a schematic diagram showing a modified form of the disc plate used in the spin coating apparatus of FIG. 18.

The used annular disc plate 13B has a cross sectional area of a streamline shape, as shown in FIG. 19, to prevent the annular disc plate from producing turbulent flows. The variance width was 3.5 nm.

Figure 20:
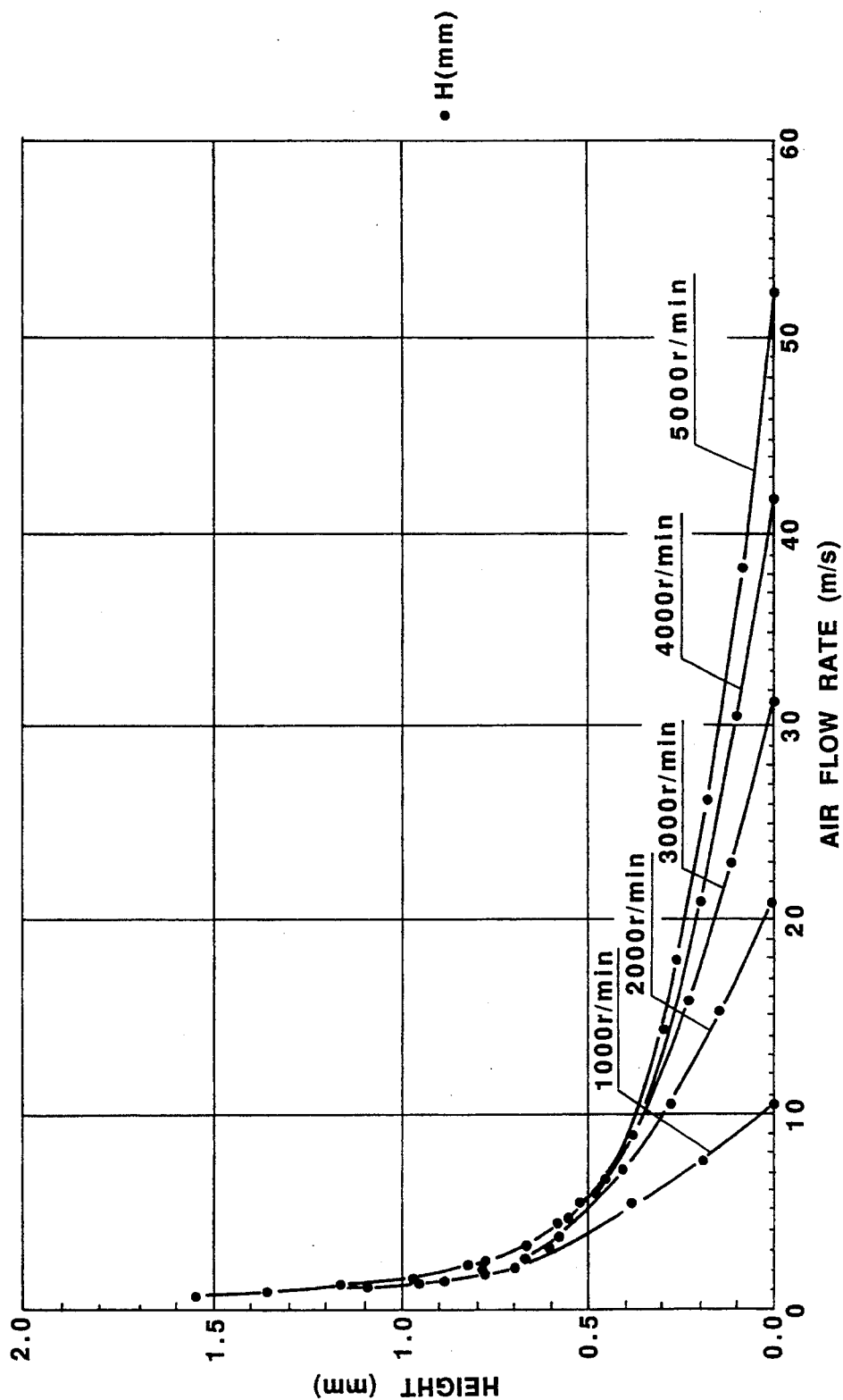
FIG. 20 is a graph of height versus air flow rate.
Figure 21:
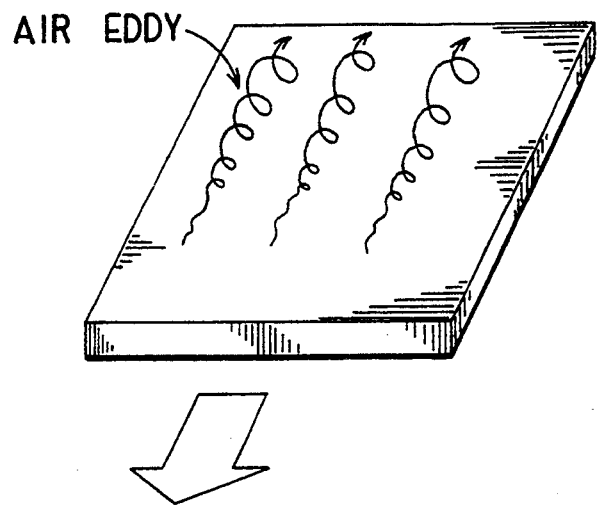
FIG. 21 is a schematic diagram used in explaining air eddies produced over the wafer.

Referring to FIG. 20, description will be made to a second embodiment of the invention. In this embodiment, the plate member (disc plate) is provided in its surface with grooves to catch the turbulent flows so as to suppress the growth of the turbulent flows. The width of the grooves can be calculated in the following manner: The fluid velocity distribution over a rotating substrate can be simplified by Karman and solved by Cochran. The inventor has calculated the fluid velocity distribution over a wafer. The result is shown in FIG. 20 which relates to air flow velocities in the direction of the periphery of an 8 inch wafer. The fluid held in contact with the wafer moves at the same velocity as the wafer. The fluid velocity decreases at a high rate as going away from the wafer. The fluid flows occur at a height of 0.5 mm or less over the wafer. Similar fluid flows occur near the surface of the plate member. With the use of a plate member rotating at a steady speed, no turbulent flow occurs in the air between the plate member and the wafer since the air rotates substantially at the same speed as the plate member. Air flows occur during acceleration, as shown in FIG. 20. The air flows produce-turbulent flows in the form of air eddies having axes extending in the direction of the velocity of the air flows, as shown in FIG. 21. These turbulent flows grow to degrade the resist film thickness uniformity. In this embodiment, the plate member (disc plate) is provided in its surface with grooves to catch the turbulent flows and move them away from the wafer to as to suppress the turbulent flows. The shape of the grooves to be formed in the surface of the plate member is determined in the following manner:

(1) For Non-Rotating Plate Member
From equations obtained by Karman, $$Ur = \omega_0 \times r \times F(\lambda) \quad (12)$$

$$U\eta = \omega_0 \times r \times G(\lambda) \quad (13)$$

As can be seen from Equations (12) and (13), the velocity Ur in the direction of the radius of the wafer and the velocity $U\Phi$ in the direction of the periphery of the wafer are in direct proportion to r. Thus, the following differential equations are established:

$$\Delta r = Ar\Delta t \quad (14)$$

$$\Delta l = Br\Delta t \quad (15)$$

where A and B are constants. The following approximation is possible:

$$\Delta\theta = \frac{\Delta l}{r + \Delta r} = \frac{\Delta l}{r}\left(\frac{1}{1 + \Delta r/r}\right) \approx \frac{\Delta l}{r}$$

Thus, the differential equations are rewritten as:

$$dr = Ard \quad (16)$$

$$d\theta = Bdt \quad (17)$$

Solving these equations gives $$dr/r = Adt$$

$$r = e^{At+C}$$

When t=0, r=r$_0$.    $e^C = r_0$ Thus, $$r = r_0 e^{At} \quad (18)$$

From Equation (17)

$$\theta = Bt + D$$

When t=0, $\theta = \theta_0$    /d=$\theta_0$ Thus, $$\theta = Bt + \theta_0 \quad (19)$$

Substituting Equation (19) into Equation (18) gives $$r = r_0 e^{\frac{A}{B}(\theta - \theta_0)} \quad (20)$$

From Equations (12) and (16), $$dr/dt = Ar = Ur = \omega_0 \times r \times F(\lambda) \quad B = \omega_0 \times G(\lambda)$$

Thus, the equation for the grooved lines is $$r = r_0 e^{\frac{F(\lambda)}{G(\lambda)}(\theta - \theta_0)}$$

(2) For Rotating Plate Member

The coordinates should be placed on the rotating plate member (disc plate) to know the air flows as viewed from the rotating plate member. From Equations (12) and (13)

$$U'r = \omega_0 \times r \times F(\lambda) \quad (21)$$

$$U'\eta = \omega_0 \times r \times \{1 - G(\lambda)\} \quad (22)$$

Thus, the equation for the grooved lines is $$r = r_0 e^{\frac{F(\lambda)}{1 - G(\lambda)}(\theta - \theta_0)} \quad (23)$$

Description will be made to the dimensions of the grooves to be formed in the plate member surface facing to the wafer when the plate member is of the type not rotated. It is possible to suppress the growth of the turbulent flows produced over the substrate by forming spiral grooves, according to the above equation, in the surface of the plate member facing to the substrate. The grooves are formed in a shape conforming to the shape of the turbulent flows so that the turbulent flows can be introduced into the grooves with high efficiency. It is apparent from the foregoing that the loci of the air flows vary according to the height with respect to the wafer. The loci are presented as:

$$r = r_0 e^{\frac{F}{G}(\theta - \theta_0)} \quad (24)$$

$$F \approx a + b\lambda + c\lambda^2 + d\lambda^3 + h\lambda^4 + i\lambda^5$$

$$G \approx j + k\lambda + l\lambda^2 + m\lambda^3$$

$$\lambda = \left(\frac{\omega_0}{v}\right)^{\frac{1}{2}} x$$

where r is the distance in the direction of the radius of the wafer, $\theta$ is the angle (rad), ($r_0$, $\theta_0$) is the coordinates of the initial position of the grooved lines in a cylindrical coordinate system, $\omega_0$ is the speed of rotation of the wafer, $v$ is the kinematic viscosity coefficient of the atmosphere where the material is to be coated, and x is the distance from the plate member (disc plate).

Figure 22:
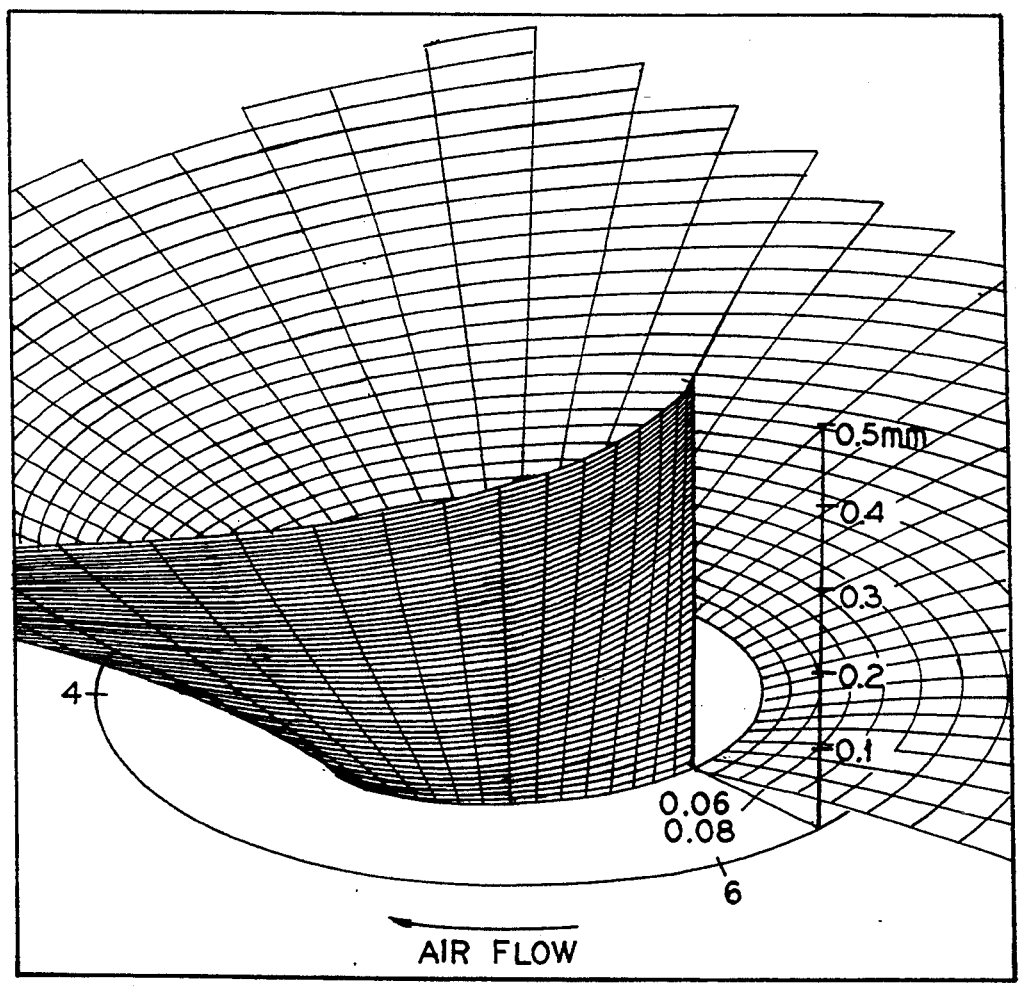
FIG. 22 is a graph used in explaining the curved surface along which air flows over the wafer.

FIG. 22 shows the curved surface presented by the above equation. The air flows move along the curved surface of FIG. 22. If the grooves are formed in the surface of the plate member according to the curved surface of FIG. 22, the turbulent flows will move smoothly along the curved surface away from the wafer. This is effective to eliminate the adverse influence of the turbulent flows on the film thickness uniformity.

As can be seen from the equation for the grooved lines, the direction of movement of the air flows is dependent on the factors $F(\lambda)$ and $G(\lambda)$ which are calculated as a function of the height with respect to the wafer. The dimensions of the grooves are obtained from FIG. 20. It can be seen from FIG. 20 that air flows occur mainly at a height of 0.5 mm or less with respect to the wafer. Thus, 0.5 mm is a sufficient depth for the grooves. Since the diameter of the air eddies is considered to be substantially the same as their height, 0.5 mm is a sufficient width for the grooves.

Description will be made to the dimensions of the grooves to be formed in the plate member surface facing to the wafer when the plate member is of the rotating type. The loci of the air flows are presented as:

$$r = r_0 e^{\frac{F}{1 - G}(\theta - \theta_0)}$$

$$F \approx a + b\lambda + c\lambda^2 + d\lambda^3 + h\lambda^4 + i\lambda^5$$

$$G \approx j + k\lambda + l\lambda^2 + m\lambda^3$$

$$\lambda = \left(\frac{\omega_0}{v}\right)^{\frac{1}{2}} x$$

Figure 23:
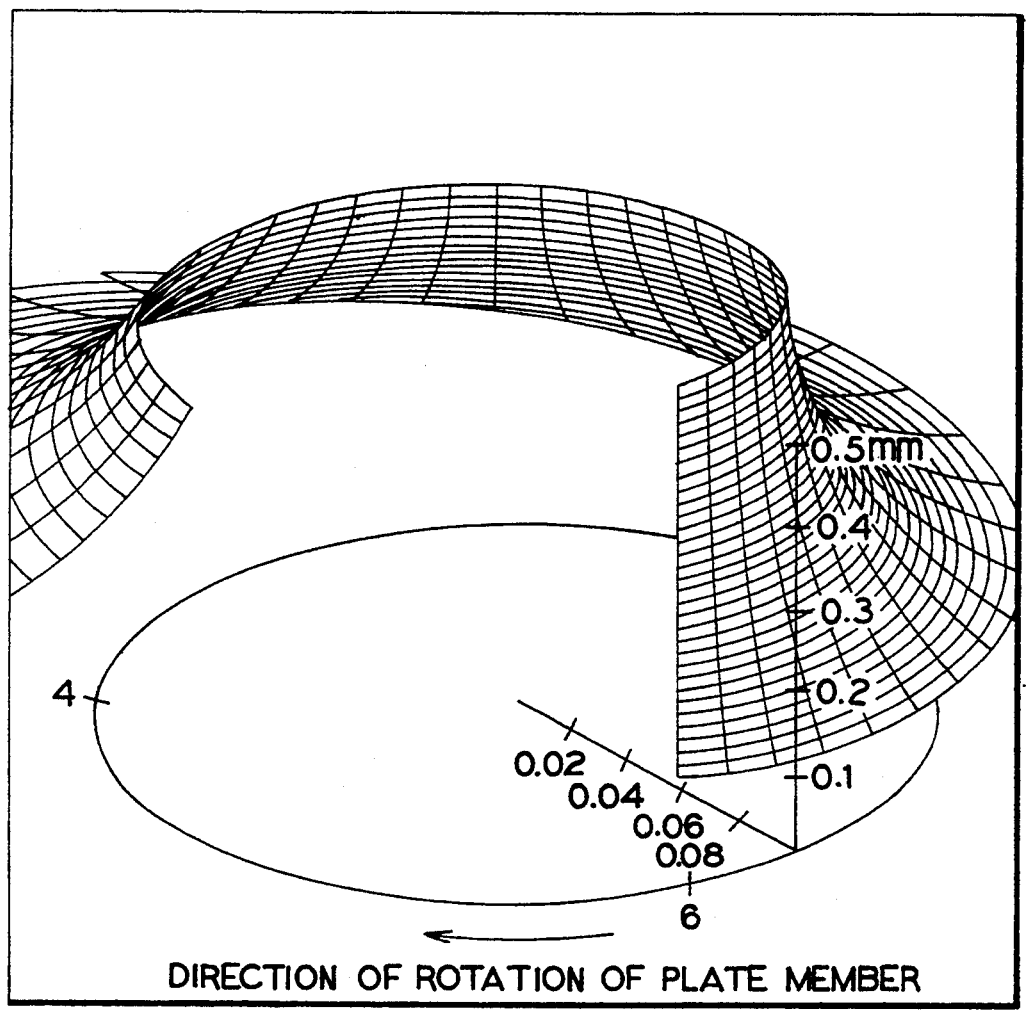
FIG. 23 is a graph used in explaining the curved surface along which air flows over the wafer.

FIG. 23 shows the curved surface presented by the above equation. In FIG. 23, the arrow indicates the direction of rotation of the plate member (disc plate). If the grooves are formed in the surface of the rotating type plate member according to the curved surface of FIG. 23, the turbulent flows will move smoothly along the curved surface away from the wafer. This is effective to eliminate the adverse influence of the turbulent flows on the film thickness uniformity.

Preferably, the constants a, b, c, d, h, i, j, k, l and m are selected in the following ranges to shape the grooves into conformance with the shape of the turbulent flows:

$$-0.1 \leq a \leq 0.1$$

$$0.3 \leq b \leq 0.6$$

$$-0.5 \leq c \leq -0.2$$

$$0.05 \leq d \leq 0.2$$

$$-0.02 \leq h \leq -0.005$$

$$0 \leq i \leq 0.001$$

$$0.9 \leq j \leq 1.1$$

$$-0.8 \leq k \leq -0.5$$

$$0.1 \leq l \leq 0.2$$

$$-0.05 \leq m \leq 0$$

EXAMPLE 12

Figure 24:
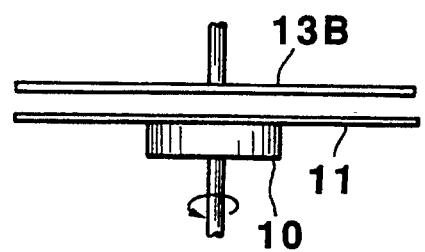
FIG. 24A is a schematic diagram showing a modified form of the spin coating apparatus of the invention.
FIG. 24B is an enlarged sectional view showing the grooves formed in the plate member of the spin coating apparatus of FIG. 24A.
FIG. 24C is a bottom view showing the grooves formed in the plate member of the spin coating apparatus of FIG. 24A.
Figure 24:
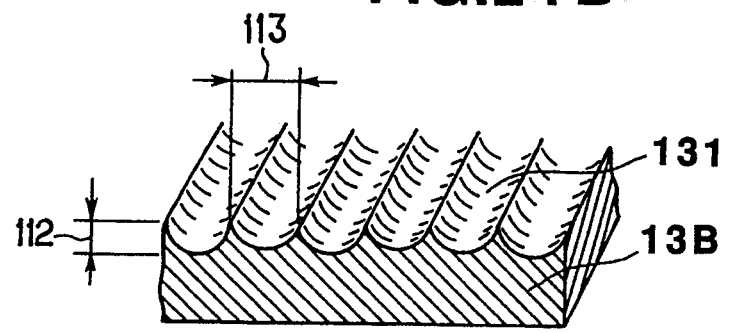
Figure 24:
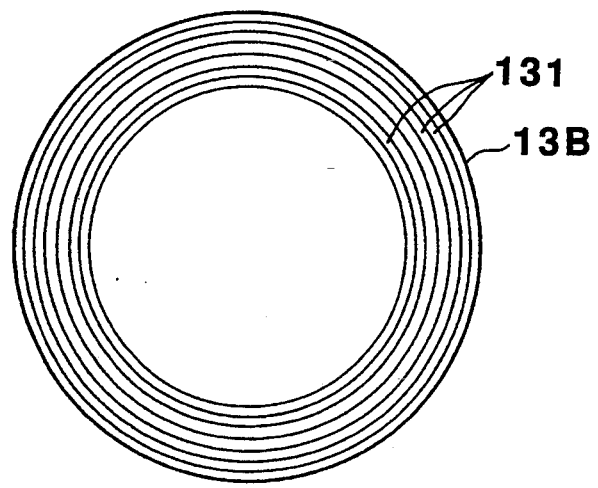
Figure 25A:
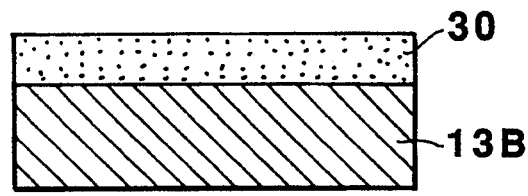
FIGS. 25A, 25B, 25C and 25D are sectional views used in explaining the manner in which the grooves are formed in the plate member of the spin coating apparatus of FIG. 24A.
Figure 25B:
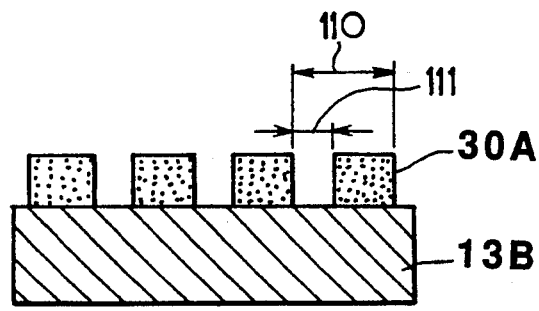
Figure 25C:
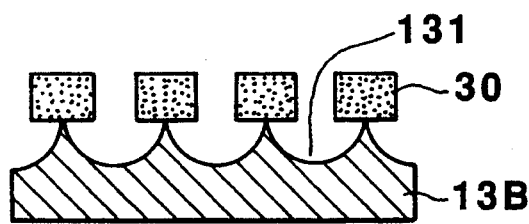
Figure 25D:
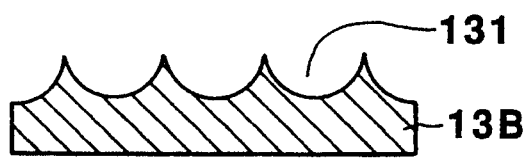

A wafer 11 was retained in a horizontal position by means of a wafer chuck 10, as shown in FIG. 24A. A disc plate (plate member) 13B was positioned over the wafer 11 in spaced-parallel relation to the wafer 11 without rotation over the wafer 11. The disc plate 13B was formed in its one surface facing to the wafer 11 with a plurality of grooves 131 in the form of coaxial circles, as shown in FIGS. 24B and 24C. The disc plate 13B was made of a quartz plate member. The disc plate 13B was coated on its one surface facing toward the wafer 11 with photo resist 30 to form a photo resist layer of 1 $\mu$m over the entire area thereof, as shown in FIG. 25A. A photolithography technique was used to form a resist pattern 30A having lines arranged at a pitch 110 of 0.5 mm and spaced at a distance 111 of 0.2 mm, as shown in FIG. 25B. The disc plate 13B was etched to form grooves 131, as shown in FIG. 25C. Acetone was used to separate the resist pattern 30A from the disc plate 13B, as shown in FIG. 25D. The thickness of the dimensions of the grooves 131 were obtained from FIG. 20. The depth 112 of the grooves 131 was 0.5 mm. The width 113 of the grooves 131 was 0.5 mm.

EXAMPLE 13

Figure 26A:
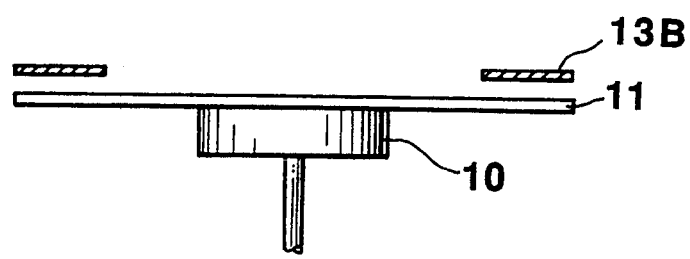
FIG. 26A is a schematic view showing a modified form of the spin coating apparatus of the invention.
Figure 26B:
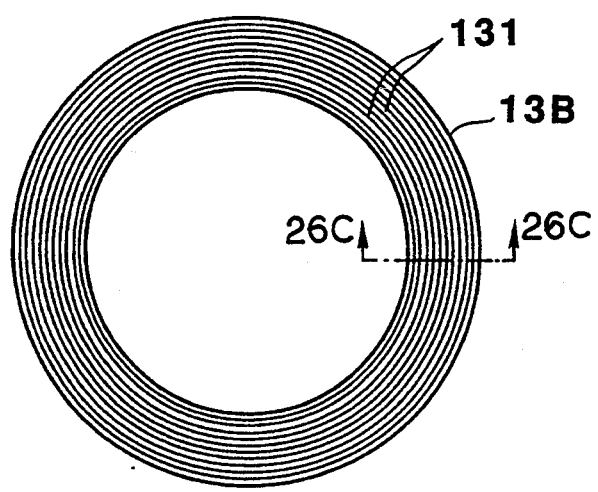
FIG. 26B is a bottom view showing the grooves formed in the plate member of the spin coating apparatus of FIG. 26A.
Figure 26C:
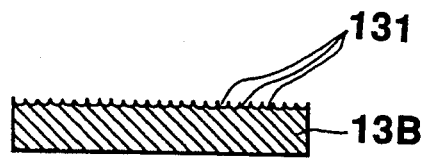
FIG. 26C is a sectional view showing the grooves formed in the plate member of the spin coating apparatus of FIG. 26A.

The used disc plate 13B has an annular or ring shape, as shown in FIGS. 26A, 26B and 26C. The annular disc plate 13B has a plurality of grooves 131 in the form of coaxial circles. The dimensions of the grooves 131 are the same as described in connection with Example 12. The diameter of the wafer 11 was 8 inches. The resist coated on the wafer was TSMR-8900 (a trademark of Tokyo Applied Chemistry, Ltd.). No turbulent flow occurred even when the wafer 11 was rotated at a speed of 5000 rpm. The variance width (Range) was 3.0 nm.

EXAMPLE 14

Figure 27A:
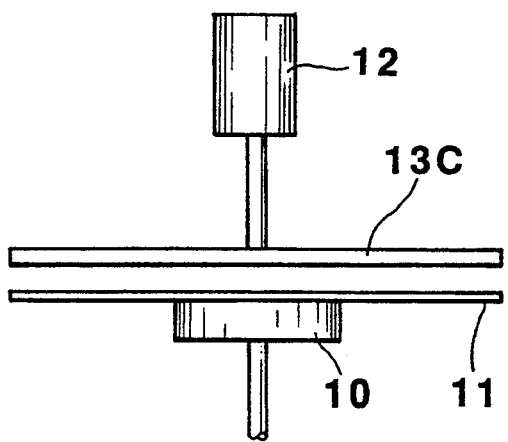
FIG. 27A is a schematic view showing a modified form of the spin coating apparatus of the invention.
Figure 27B:
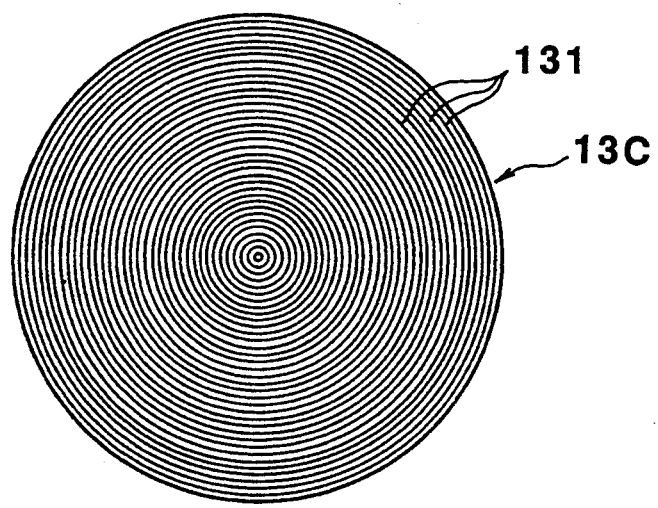
FIG. 27B is a bottom view showing the grooves formed in the plate member of the spin coating apparatus of FIG. 27A.
Figure 27C:
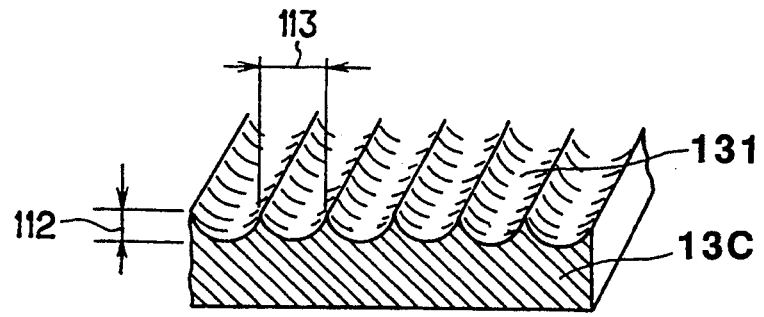
FIG. 27C is a sectional view taken on line 26C-2C of FIG. 26B showing the grooves formed in the plate member of the spin coating apparatus of FIG. 27A.

The used disc plate 13C has a disc shape, as shown in FIGS. 27A, 27B and 27C. The disc plate 13C was positioned in spaced-parallel relation to the wafer 11. An electric motor 12 was used to rotate the disc plate 13C in the same direction as the wafer 11. The disc plate 13C was formed in its one surface facing to the wafer 11 with coaxial, circular grooves 131, as shown in FIG. 27B. The dimensions of the grooves 131 is substantially the same as described in connection with Example 12, as shown in FIG. 27C. The resist coated on the wafer 11 was TSMR-8900 (a trademark of Tokyo Applied Chemistry, Ltd. ). No turbulent flow occurred even when the wafer 11 was rotated at a speed of 6000 rpm. The variance width (Range) was 3.0 nm.

EXAMPLE 15

Figure 28A:
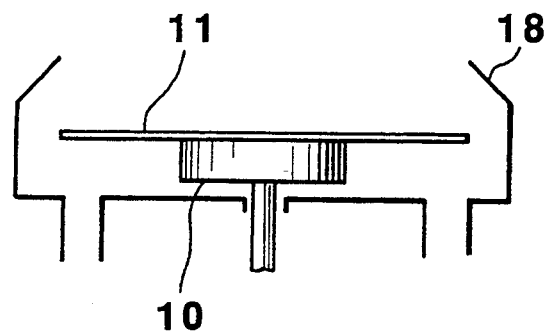
FIG. 28A is a schematic view showing a modified form of the spin coating apparatus of the invention.
Figure 28B:
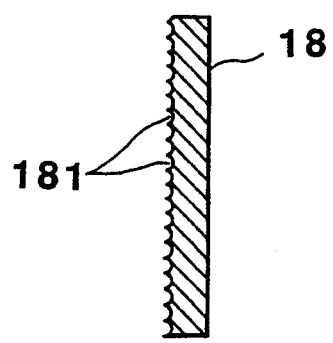
FIG. 28B is a sectional view showing the grooves formed in the inner surface of the vessel of the spin coating apparatus of FIG. 28A.

The wafer 11 was placed in a cup-shaped vessel 18 for recovery of the excessive resist splashed from the rotating wafer 11, as shown in FIG. 28A. The vessel 18 was formed in its inner surface with a number of grooves 181 extending in the direction of rotation of the wafer 11, as shown in FIG. 28B. The diameter of the wafer 11 was 8 inches. The resist coated-on the wafer 11 was TSMR-8900 (a trademark of Tokyo Applied Chemistry, Ltd. ). No turbulent flow occurred even when the wafer 11 was rotated at a speed of 6000 rpm. The variance width (Range) was 3.0 nm.

EXAMPLE 16

Figure 29:
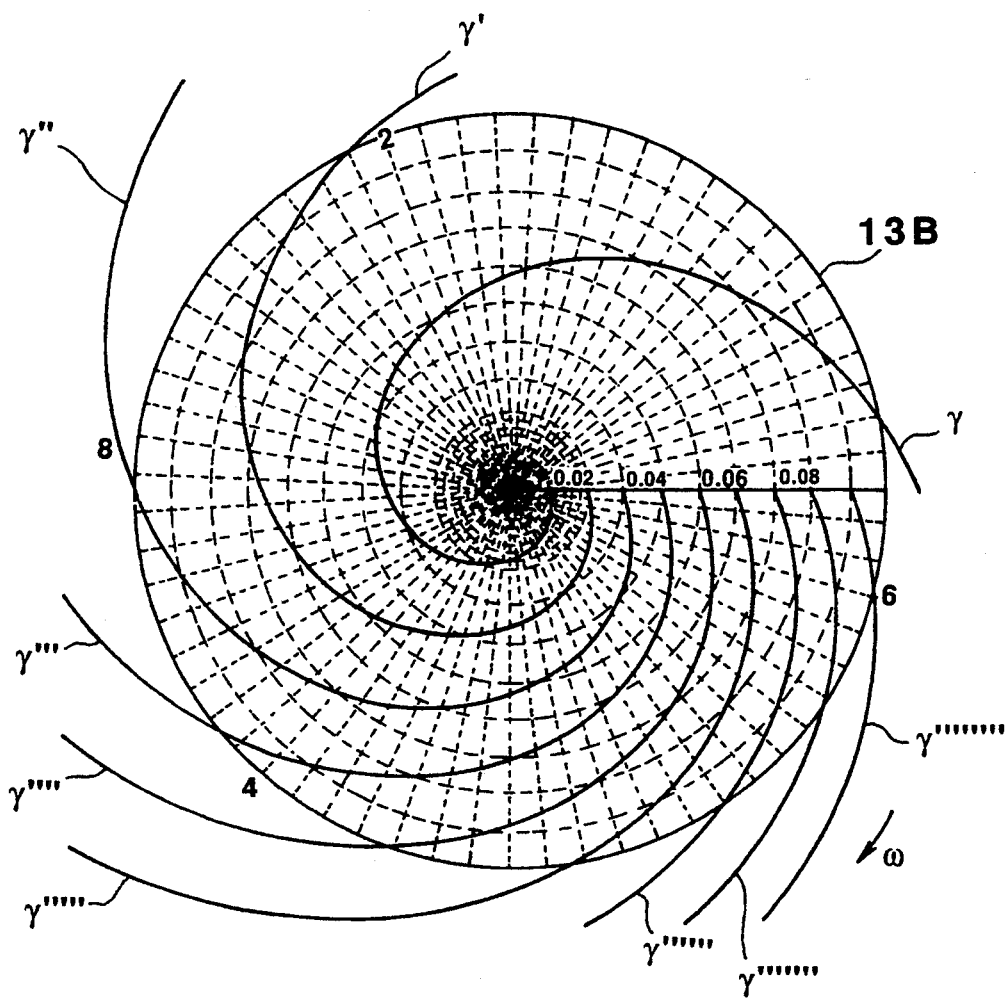
FIG. 29 is a diagram showing the loci of the air flows produced when the wafer is rotating.
Figure 30:
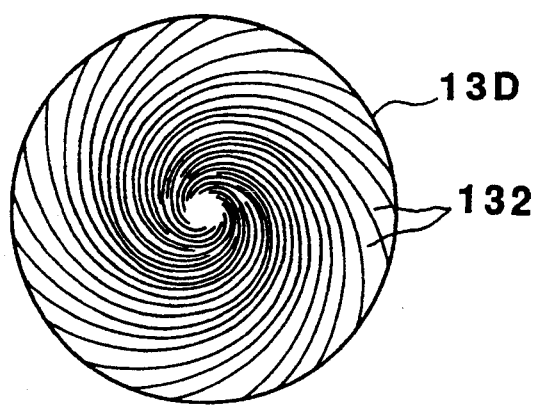
FIG. 30 is a bottom view showing the spiral grooves formed in the plate member according to the air 10. flow loci of FIG. 29.
Figure 32:
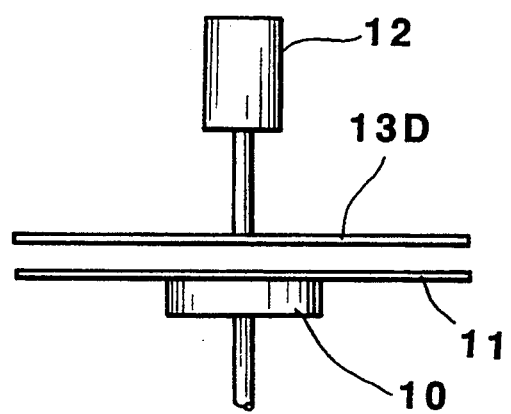
FIG. 32 is a schematic diagram showing a modified form of the spin coating apparatus of the invention.

The used disc plate 13D was substantially the same as described in connection with Example 12 except for the shape of the grooves formed in the disc plate. FIG. 29 shows loci of the air flows produced over the stationary disc plate 13D. The disc plate 13D may be formed on its one surface with spiral grooves 132 extending along the loci of the air flows of FIG. 29. In FIG. 29, the arrow W indicates the direction of rotation of the wafer 11. The spiral grooves 132 were shaped, as shown in FIG. 30. The dimensions of the spiral grooves 132 were obtained from FIG. 20. The depth of the spiral grooves 132 was 0.5 mm. The width of the spiral grooves 132 was 0.5 mm. The diameter of the wafer 11 was 8 inches. The resist coated on the wafer 11 was TSMR-8900 (a trademark of Tokyo Applied Chemistry, Ltd. ). No turbulent flow occurred even when the wafer 11 was rotated at a speed of 5000 rpm. The variance width (Range) was 3.5 nm.

EXAMPLE 17

Figure 31:
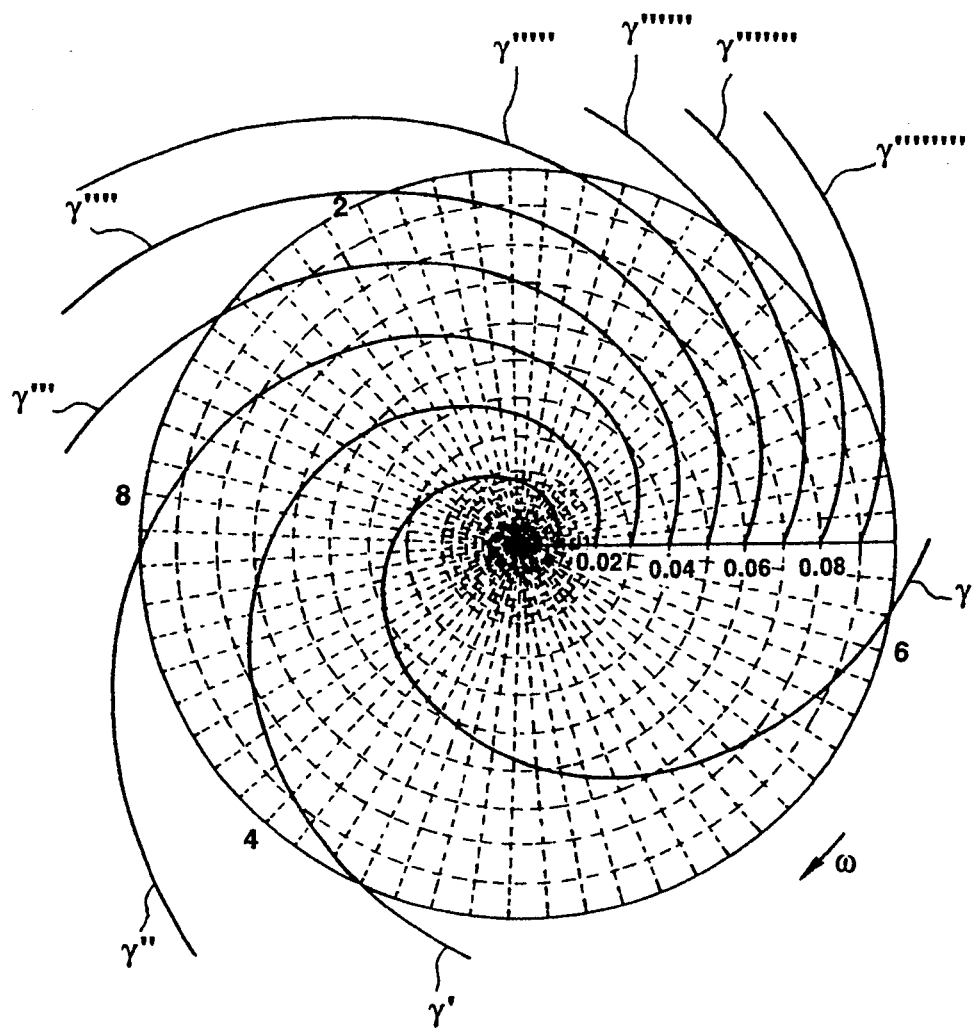
FIG. 31 is a diagram showing the loci of the air flow produced when the wafer is rotating.

FIG. 31 shows loci of the air flows produced over the disc plate 13D rotating at the same direction as the wafer 11. The disc plate 13D may be formed on its one surface with spiral grooves 132 extending along the loci of the air flows of FIG. 31. In FIG. 31, the arrow W indicates the direction of rotation of the wafer 11. An electric motor 12 was used to rotate the disc plate 13D in the same direction as the wafer 11. The shape and dimensions of the spiral grooves 132 were substantially the same as described in connection with Example 16. The resist coated on the wafer 11 was TSMR-8900 (a trademark of Tokyo Applied Chemistry, Ltd.). No turbulent flow occurred even when the wafer 11 was rotated at a speed of 5000 rpm. The variance width (Range) was 3.0 nm.

EXAMPLE 18

It is not required to form the spiral grooves 132 over the entire area of the one surface of the disc plate 13D. The spiral grooves 132 may be formed only in the disc plate surface zone where turbulent flows occur. This disc plate surface zone is presented as:

$$r \geq \sqrt{(Re \times v/\omega)}$$

where r is the distance from the center of rotation of the disc plate 13D, Re is the Reynolds number at which turbulent flows occur, $v$ is the kinematic viscosity coefficient of the atmosphere in which the resist is coated, and $\omega$ is the speed of rotation of the disc plate 13D.

Figure 33A:
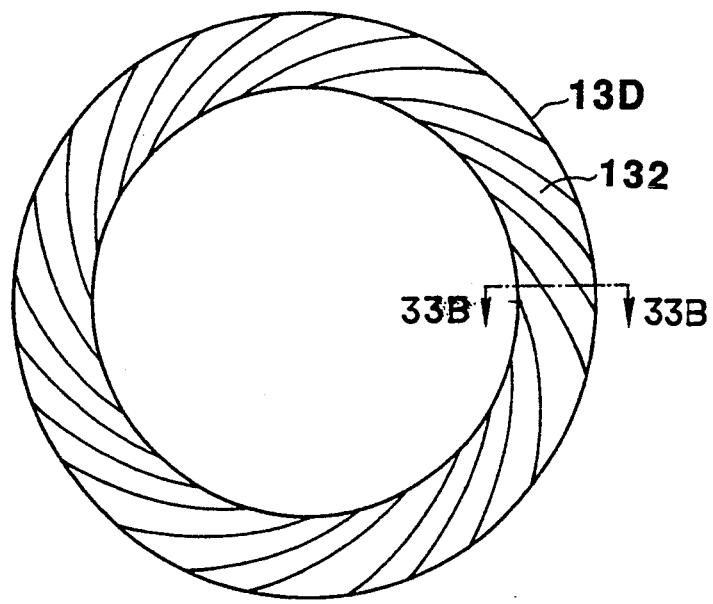
FIG. 33A is a bottom view showing the grooves formed in the plate member of the spin coating apparatus.
Figure 33B:
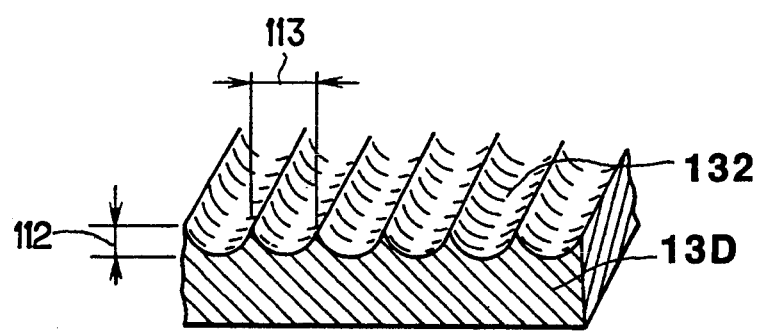
FIG. 33B is a sectional view taken on line 33B—33B of FIG. 33A showing the grooves formed in the plate member of the spin coating apparatus.

The disc plate 13D was formed only in an annular zone of its one surface near its periphery with spiral grooves 132, as shown in FIGS. 33A and 33B. The annular zone is defined by the periphery of the disc plate 13D and a circle separated at a distance of 80 mm from the center of rotation of the disc plate 13D, as shown in FIG. 33A. The dimensions of the grooves 132 are substantially the same as described in connection with Examples 16 and 17. The diameter of the wafer 11 was 8 inches. The resist coated on the wafer 11 was TSMR-8900 (a trademark of Tokyo Applied Chemistry, Ltd.). No turbulent flow occurred even when the wafer 11 was rotated at a speed of 5000 rpm. The variance width (Range) was 3.0 nm.

EXAMPLE 19

Figure 34:
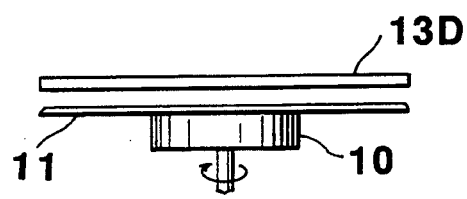
FIG. 34A is a schematic view showing a modified form of the spin coating apparatus of the invention.
FIG. 34B is a bottom view showing the grooves formed in the plate member of the spin coating apparatus of FIG. 34A.
FIG. 34C is an enlarged perspective view showing the grooves formed in the plate member of the spin coating apparatus of FIG. 34A.
Figure 34:
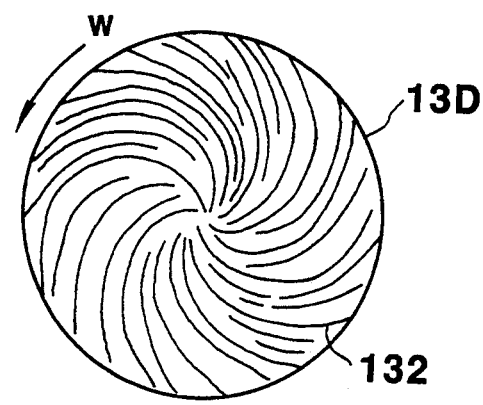
Figure 34:
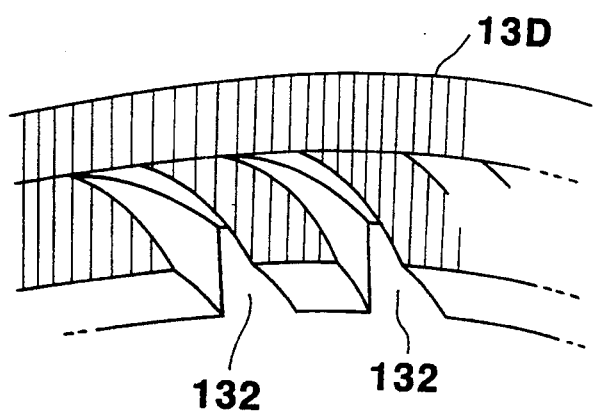

The air flows produced over the stationary disc plate move along the curved surface of FIG. 22. If the spiral grooves are shaped according to the curved surface of FIG. 22, the turbulent flows will move smoothly along the curved surface away from the wafer. A wafer 11 was retained in a horizontal position by means of a wafer chuck 10, as shown in FIG. 34A. A disc plate.

13D was positioned over the wafer 11 in spaced-parallel relation to the wafer 11 without rotation over the wafer 11. The disc plate 13D was formed in the entire area of its one surface facing to the wafer 11 with a plurality of spiral grooves 132, as shown in FIG. 34B. The spiral grooves 132 are shaped to meet the Equation (24), as shown in FIG. 34C. The pitch of the spiral grooves 132 was 0.5 min. The diameter of the wafer 11 was 8 inches. The resist coated on the wafer 11 was TSF-8900 (a trademark of Tokyo Applied Chemistry, Ltd.). No turbulent flow occurred even when the wafer 11 was rotated at a speed of 5000 rpm. The variance width (Range) was 3.5 nm.

EXAMPLE 20

Figure 35A:
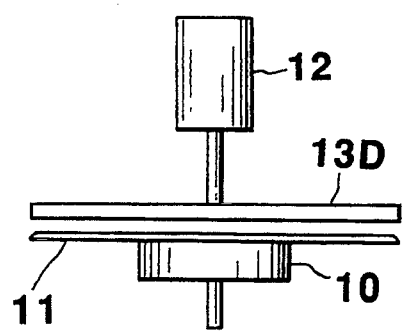
FIG. 35A is a schematic view showing a modified form of the spin coating apparatus of the invention.
Figure 35B:
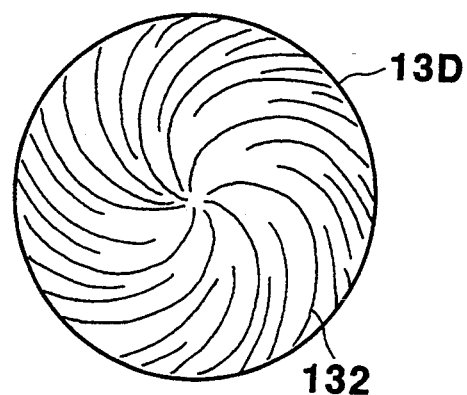
FIG. 35B is a bottom view showing the grooves formed in the plate member of the spin coating apparatus of FIG. 35A.
Figure 35C:
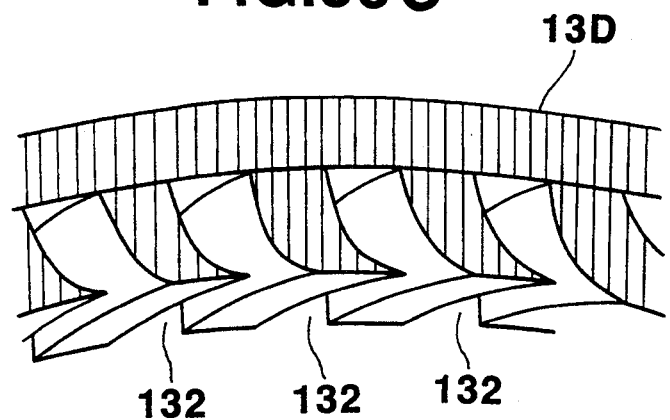
FIG. 35C is an enlarged perspective view showing the grooves formed in the plate member of the spin coating apparatus of FIG. 35A.

The air flows produced over the rotating disc plate move along the curved surface of FIG. 23. If the spiral grooves are shaped according to the curved surface of FIG. 23, the turbulent flows will move smoothly along the curved surface away from the wafer. A wafer 11 was retained in a horizontal position by means of a wafer chuck 10, as shown in FIG. 35A. A disc plate 13D was positioned over the wafer 11 in spaced-parallel relation to the wafer 11. An electric motor 12 was used to rotate the disc plate 13D in the same direction as the wafer 11. The disc plate 13D was formed in the entire area of its one surface facing to the wafer 11 with a plurality of spiral grooves 132, as shown in FIG. 35B. The spiral grooves 132 are shaped to meet the Equation (23), as shown in FIG. 35C. The pitch of the spiral grooves 132 was 0.5 mm. The diameter of the wafer 11 was 8 inches. The resist coated on the wafer 11 was TSMR-8900 (a trademark of Tokyo Applied Chemistry, Ltd. ). No turbulent flow occurred even when the wafer 11 was rotated at a speed of 5000 rpm. The variance width (Range) was 3.0 nm.

EXAMPLE 21

It is not required to form the spiral grooves 132 over the entire area of the one surface of the disc plate 13D. The spiral grooves 132 may be formed only in the disc plate surface zone where turbulent flows occur. This disc plate surface zone is presented as:

$$r \geq \sqrt{(Re \times v/\omega)}$$

where r is the distance from the center of rotation of the disc plate 13D, Re is the Reynolds number at which turbulent flows occur, $v$ is the kinematic viscosity coefficient of the atmosphere in which the resist is coated, and $\omega$ is the speed of rotation of the disc plate 13D.

Figure 36A:
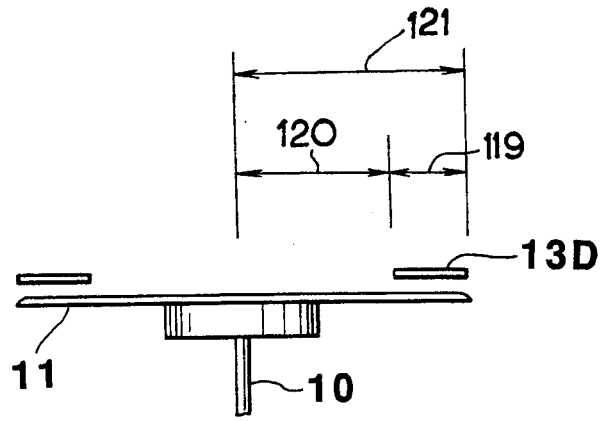
FIG. 36A is a schematic view showing a modified form of the spin coating apparatus of the invention.
Figure 36B:
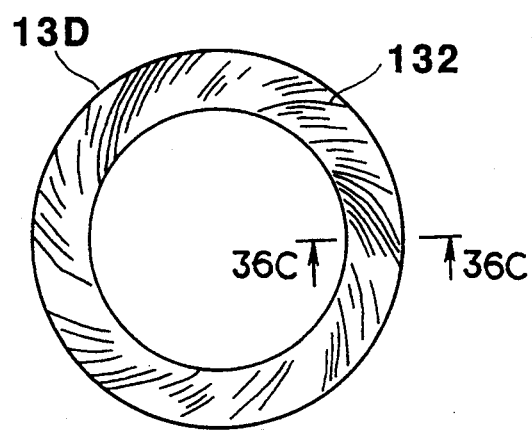
FIG. 36B is a bottom view showing the grooves formed in the plate member of the spin coating apparatus of FIG. 36A.
Figure 36C:
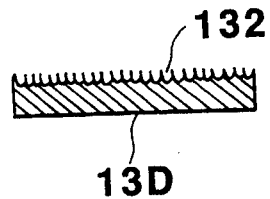
FIG. 36C is an enlarged sectional view taken on line 36C—36C of FIG. 36B showing the grooves formed in the plate member of the spin coating apparatus of FIG. 36A.

The disc plate 13D was formed only in an annular zone of its one surface near its periphery with spiral grooves 132, as shown in FIGS. 36A, 36B and 36C. The annular zone has a width 119 of 17 mm is defined by the periphery of the disc plate 13D and a circle separated at a distance 120 of 83 mm from the center of rotation of the disc plate 13D, as shown in FIG. 36A. The dimensions of the grooves 132 are substantially the same as described in connection with Examples 16 and 17. The diameter 121 of the wafer 11 was 100 mm. The resist coated on the wafer 11 was TSMR-8900 (a trademark of Tokyo Applied Chemistry, Ltd. ). No turbulent flow occurred even when the wafer 11 was rotated at a speed of 5000 rpm. The variance width (Range) was 3.0 nm.

Figure 37:
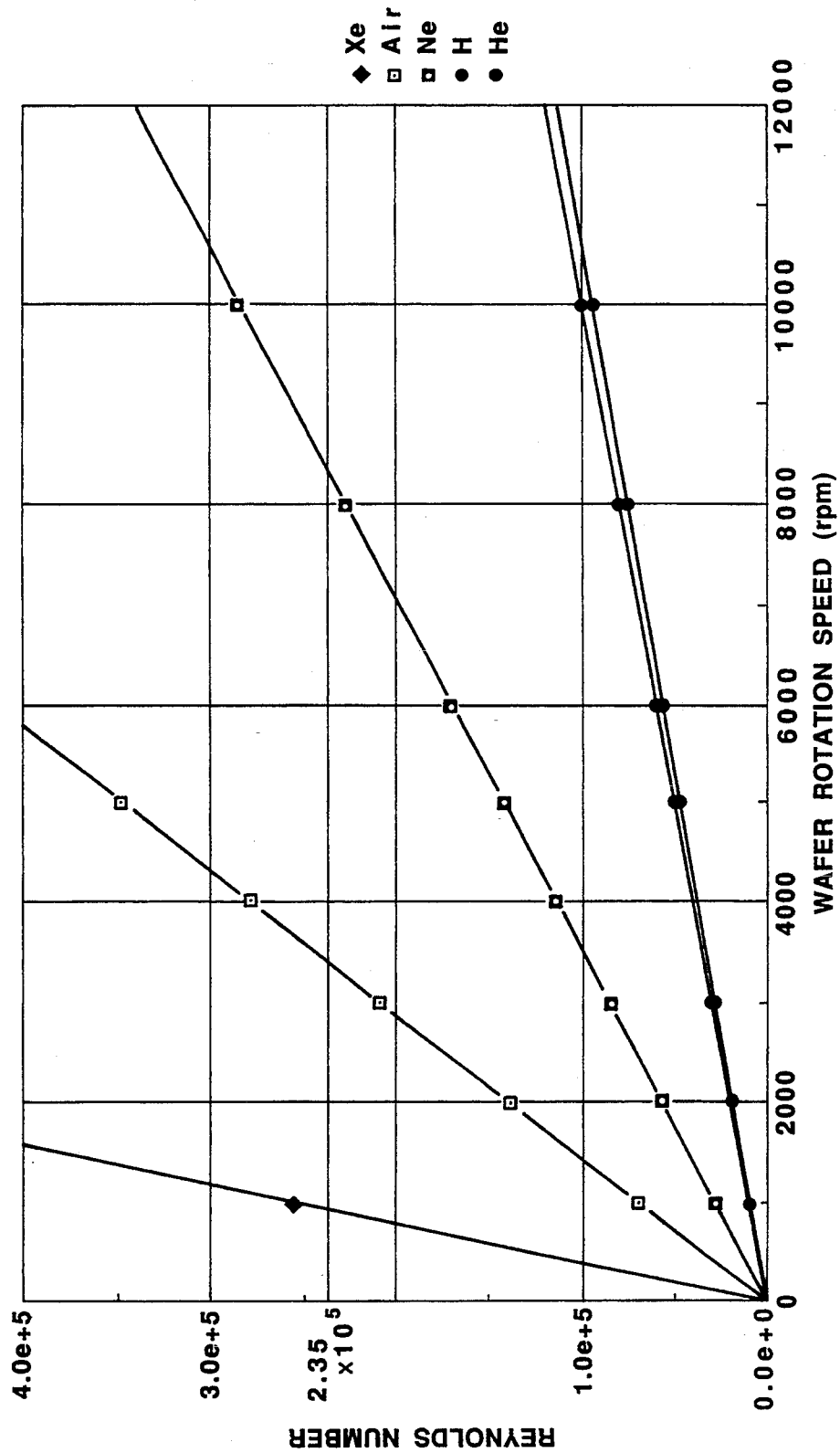
FIG. 37 is a graph of Reynolds number versus wafer rotation speed.

Referring to FIG. 37, description will be made to a third embodiment of the invention. The Reynolds number (Re) can be used to estimate the zone where turbulent flows occur. In general, turbulent flows occuring a spin coating apparatus when $Re = 2.35 \times 10^5$. The Reynolds number Re is presented as:

$$Re = \rho r^2 \omega / \eta = r^2 \omega / v$$

where r is the distance from the center of rotation of the disc plate 13D, $\eta$ is the viscosity coefficient, $v$ is the kinematic viscosity coefficient of the atmosphere in which the resist is coated, and $\omega$ is the speed of rotation of the disc plate 13D.

No turbulent flow occurs when the Reynolds number Re is $2.35 \times 10^5$ or less. The required kinematic viscosity coefficient $v$ of the gas providing the atmosphere in which the spin coating operation is performed is determined as:

$$v \geq r^2 \omega / Re$$

$$\geq r^2 \omega / 2.35 \times 10^5$$

It is, therefore, apparent that the tendency of turbulent flows to occur decreases as the kinematic viscosity coefficient increases. FIG. 37 shows the maximum possible speeds of rotation of an 8 inch wafer (semiconductor substrate) for different kinds of atmosphere. As can be seen from FIG. 37, the Reynolds number exceeds $2.35 \times 10^5$ and turbulent flows occur when the wafer rotation speed exceeds 4000 rpm in the atmosphere of air. The Reynolds number is $2.35 \times 10^5$ or less and no turbulent flow occurs even when the wafer rotation speed is 8000 rpm in the atmosphere of Ne. No turbulent flow occurs at 25000 rpm in the atmosphere of He or H.

Figure 38:
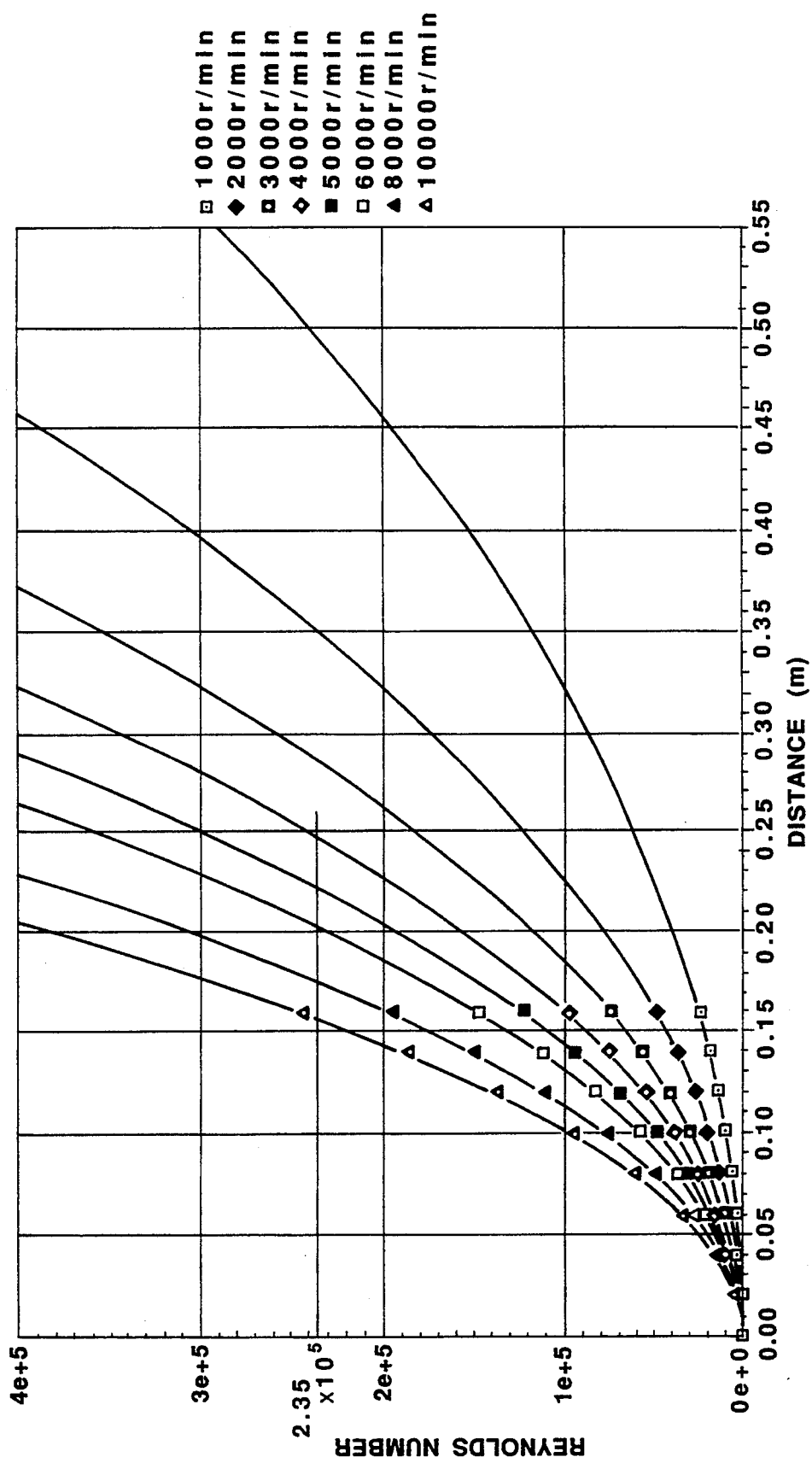
FIG. 38 is a graph of Reynolds number versus distance.

FIG. 38 shows the maximum possible coating distances from the center of rotation of the wafer for different wafer rotation speeds in the atmosphere of He. As can be seen from FIG. 38, a wafer having a diameter of about 500 mm can be coated while rotating at 4000 rpm. It is, therefore, possible to decrease the Reynolds number by providing an atmosphere of a gas having a large kinematic viscosity coefficient. The kinematic viscosity coefficients of various gases are as follows:

Air: $1.51 \times 10^{-5}$ m²/s

Ne: $3.69 \times 10^{-5}$ m²/s

He: $1.10 \times 10^{-4}$ m²/s

H: $1.05 \times 10^{-4}$ m²/s (20° C., 1 atm)

Figure 39:
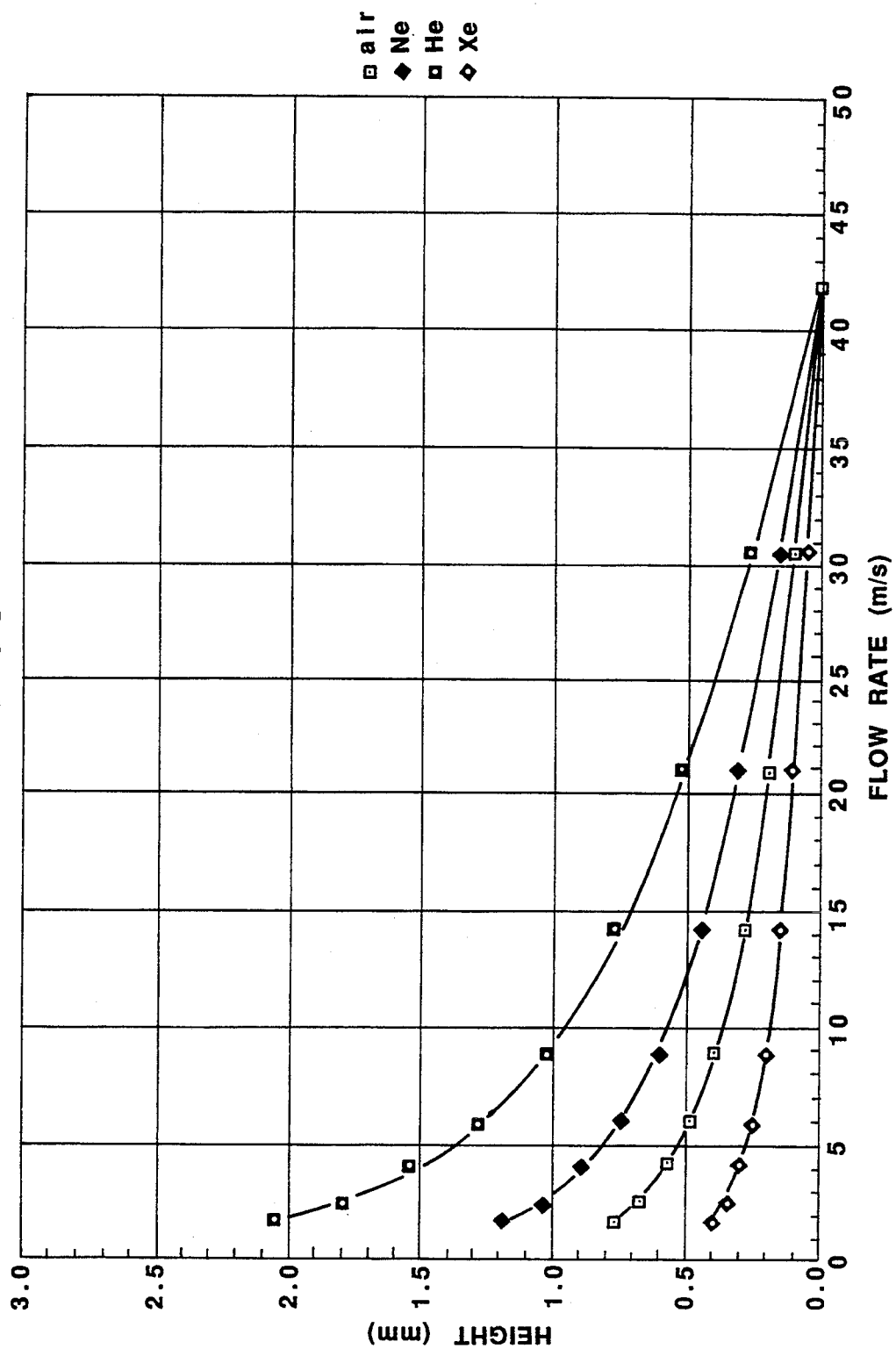
FIG. 39 is a graph of height versus flow rate.
Figure 40:
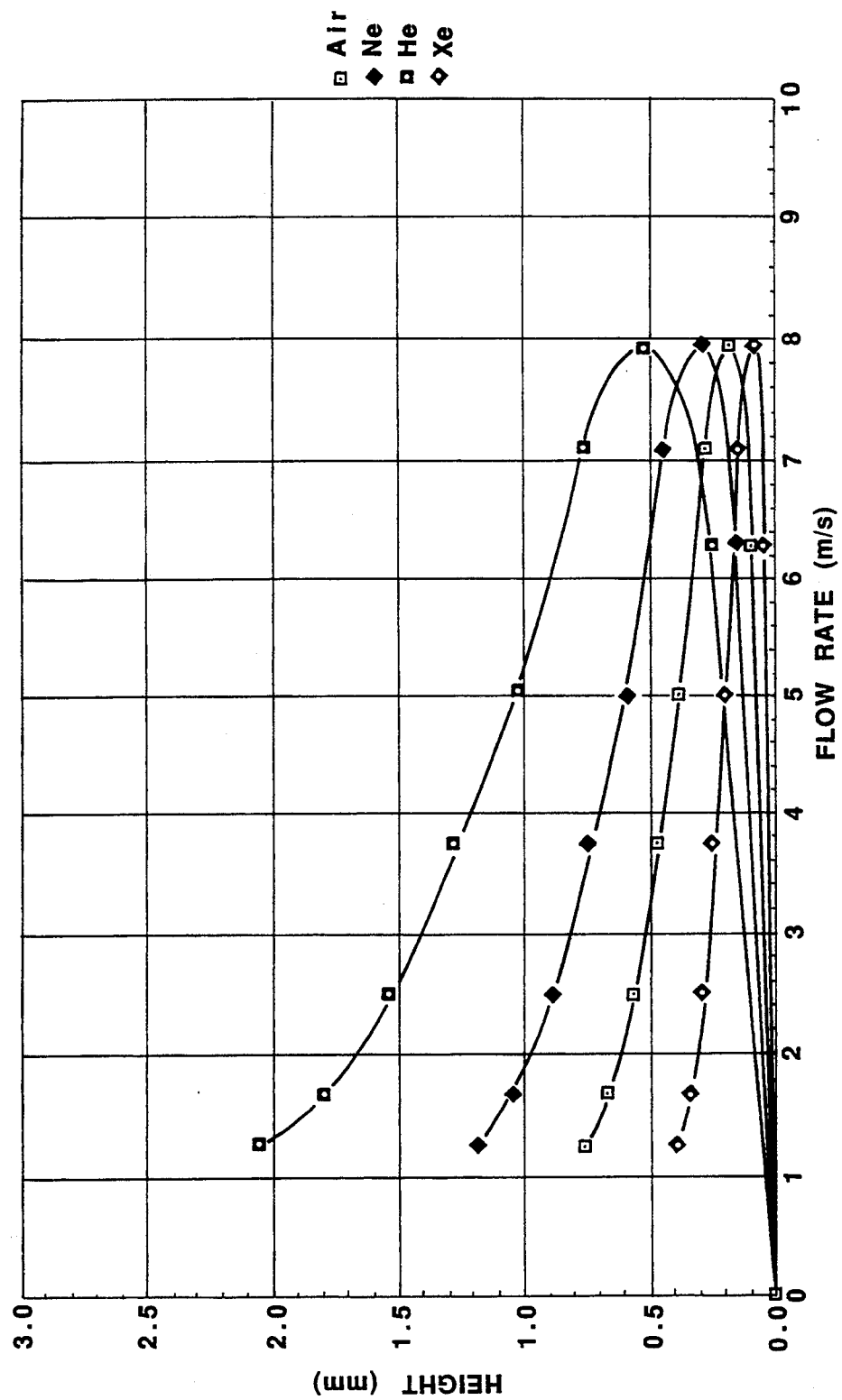
FIG. 40 is a graph of height versus flow rate.

The amount of the gas used for the spin coating operation is an important factor since some of these gases are expensive. The required gas amount is calculated as follows: Von Karman and Cochran methods can be used to calculate the velocity distribution of the fluid flows produced over the wafer due to its rotation. The calculated results are shown in FIGS. 39 and 40. FIG. 39 relates to the fluid velocities in the direction of the periphery of a wafer having a diameter of 8 inches. The fluid (gas) held in contact with the wafer moves at the same velocity as the wafer. The fluid velocity decreases at a high rate as going away from the wafer. This rate is dependent on the kinematic viscosity coefficient of the fluid (gas). The greater the kinematic viscosity coefficient, the smaller the rate at which the fluid velocity decreases. For example, the fluid velocity decreases to 0.2 m/s at a height of 0.7 mm above the wafer in the atmosphere of air, whereas the fluid velocity decreases to 0.2 m/s at a height of 1.8 mm above the wafer in the atmosphere of He.

FIG. 40 relates to the fluid velocities in the direction of the radius of the wafer. The fluid (gas) is accelerated due to the centrifugal force acting thereon. The degree to which the fluid is accelerated is dependent on the kind of the fluid. For example, in the atmosphere of air, the fluid velocity is at maximum (7.9 m/s) at a height of 0.2 mm above the wafer and it decreases to 1 m/s at a height of 0.8 mm above the wafer. In the atmosphere of He, the fluid velocity is at maximum at a height of 0.5 mm above the wafer and it decreases to 1 m/s at a height of 2 mm or more above the wafer. It is, therefore, apparent that the fluid flows occur at a height of 2 mm or less above the wafer. That is, the zone to be filled with a gas having a high kinematic viscosity coefficient is at a height of about 2 mm above the wafer.

Figure 41:
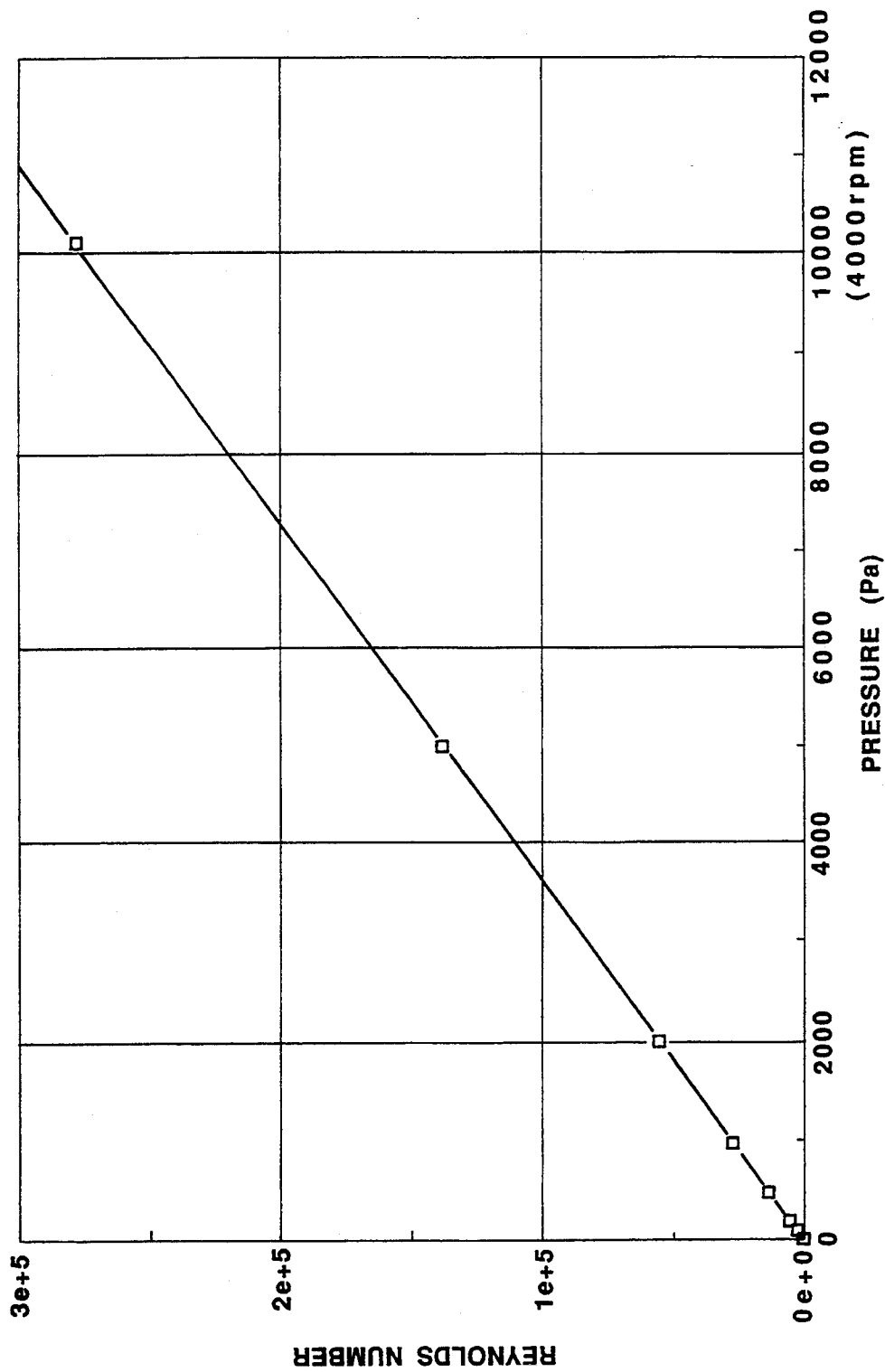
FIG. 41 is a graph of Reynolds number versus pressure.

For a rotating disc plate, the Reynolds number is defined as:

$$Re = \rho r^2 \omega / \eta = r^2 \omega / \upsilon \tag{25}$$

where r is the distance from the center of rotation of the disc plate, $\eta$ is the viscosity coefficient, $\upsilon$ is the kinematic viscosity coefficient of the atmosphere, and $\omega$ is the speed of rotation of the disc plate. The viscosity coefficient $\eta$ is almost unchanged regardless of the pressure, whereas the density $\rho$ changes with pressure changes. The density $\rho$ is given as:

$$\rho = \frac{1.293}{1 + 0.00367t} \cdot \frac{P}{760} \; (Kg/m^3) \tag{26}$$

where P is the atmospheric pressure (MMHg) and t is the ambient temperature (°C.). The relationship between the Reynolds number and the atmospheric pressure is determined from Equations (25) and (26). This relationship is shown in FIG. 41 which relates to an 8 inch wafer rotated at 4000 rpm. As can be seen from FIG. 41, the Reynolds number decreases as the atmospheric pressure decreases.

Figure 42:
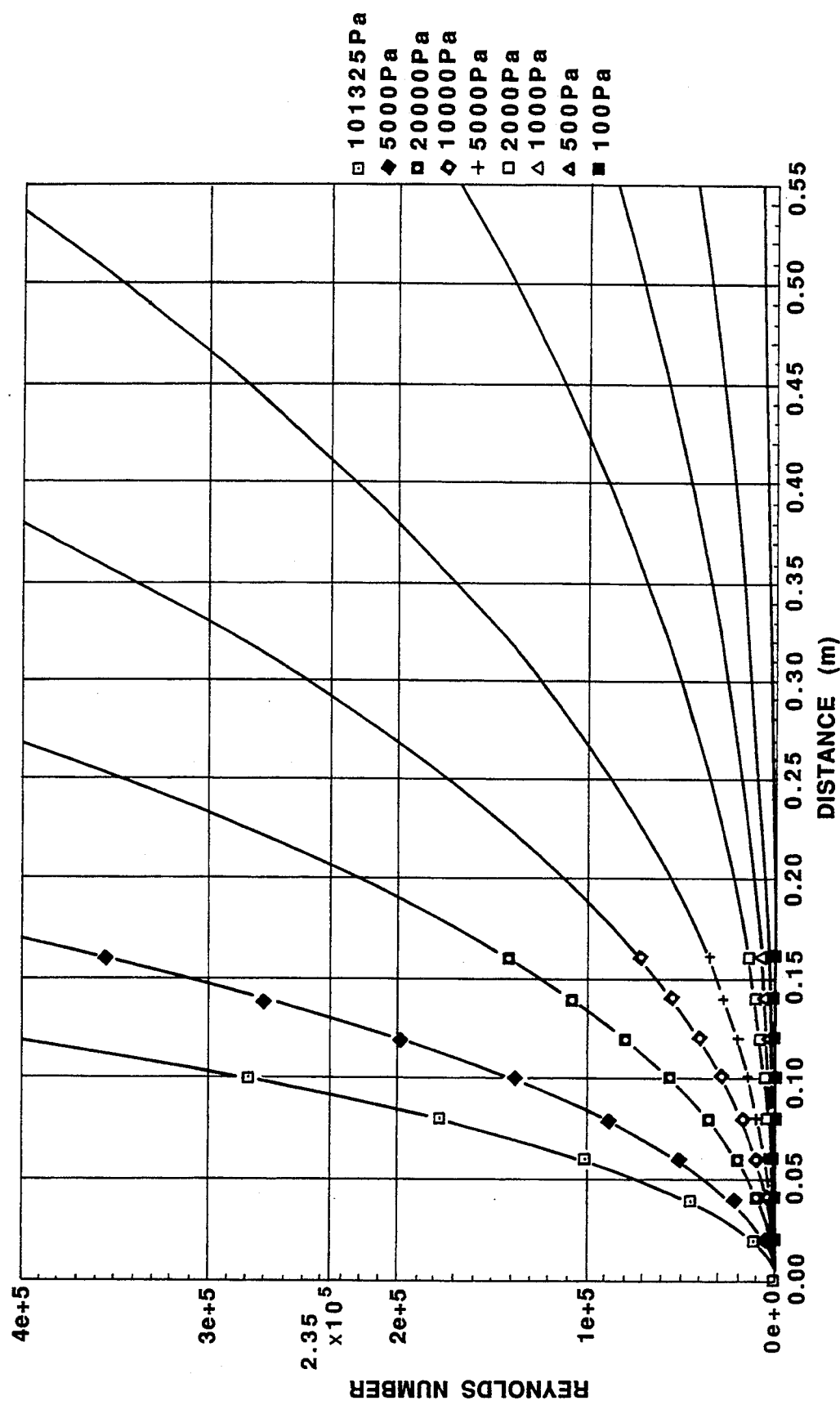
FIG. 42 is a graph of Reynolds number versus distance.

FIG. 42 shows the relationship between the Reynolds number and the wafer diameter, that is, the distance from the center of rotation of the wafer, for different pressures. The speed of rotation of the wafer is at 4000 rpm. It can be seen from FIG. 42, spin coating is possible for wafers having a diameter of 0.5 m if the pressure is decreased to 10000 Pa.

Figure 43:
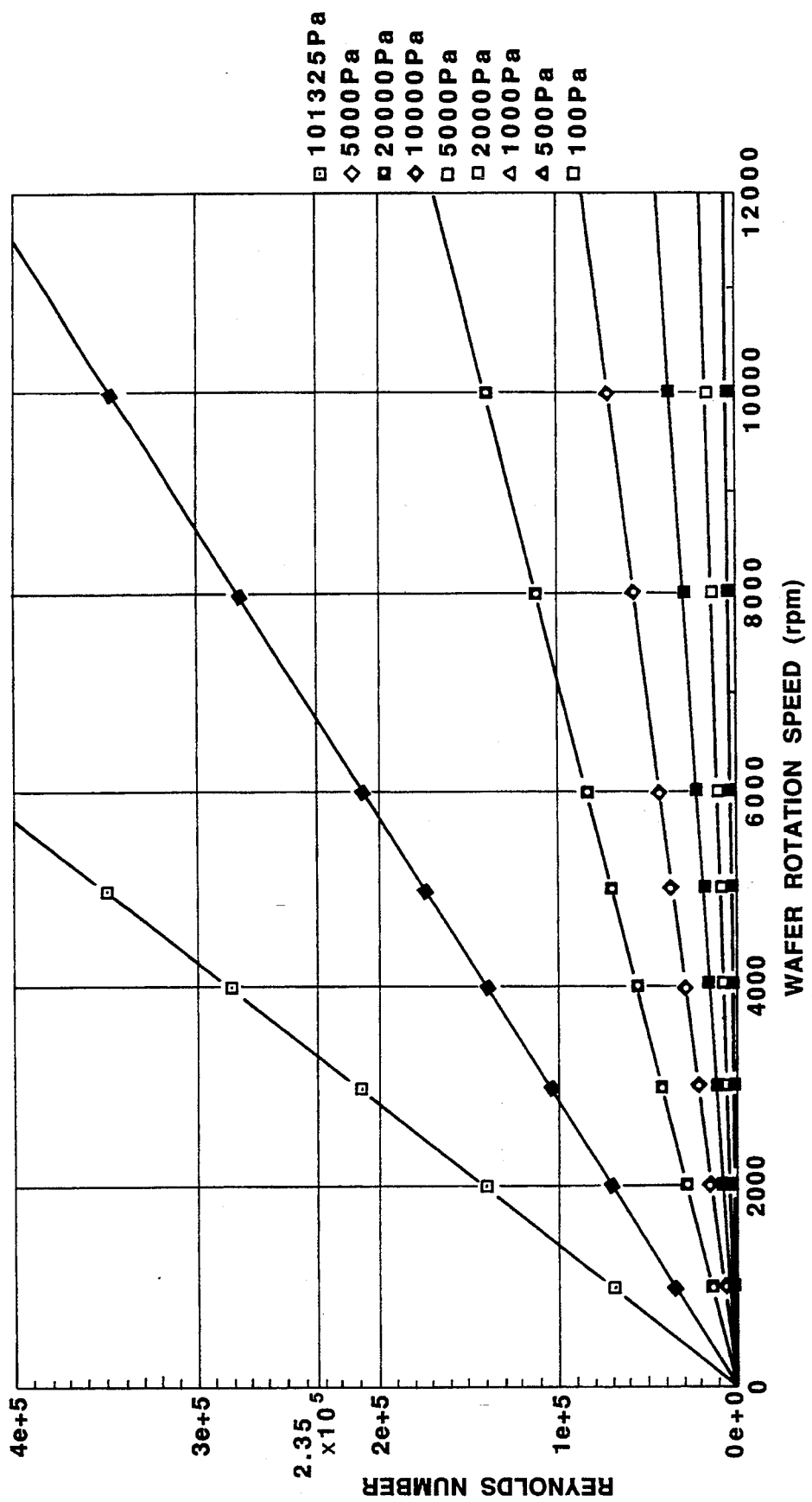
FIG. 43 is a graph of Reynolds number versus wafer rotation speed.

FIG. 43 shows the relationship between the Reynolds number and the wafer rotation speed for different pressures. The diameter of the wafer is 8 inches. It can be seen from FIG. 43 that spin coating is possible at a speed of 6000 rpm or more if the pressure is decreased to 50000 Pa and at a speed of 12000 rpm or more if the pressure is decreased to 2000 Pa.

No turbulent flow will occur if the Reynolds number is $2.35 \times 10^5$ or less. The Reynolds number is given as:

$$Re = \rho r^2 \omega / \eta = r^2 \omega / \upsilon$$

where r is the distance from the center of rotation of the disc plate 13D, $\eta$ is the viscosity coefficient, $\upsilon$ is the kinematic viscosity coefficient of the atmosphere in which the resist is coated, and $\omega$ is the speed of rotation of the wafer.

No turbulent flow occurs when the Reynolds number Re is $2.35 \times 10^5$ or less. The required kinematic viscosity coefficient $\upsilon$ of the gas providing the atmosphere in which the spin coating operation is performed is determined as:

$$\upsilon = \eta/\rho \geqq r^2\omega/Re \tag{27}$$
$$\geqq r^2\omega/2.35 \times 10^5$$

The kinematic viscosity coefficient $\eta$ is held at $1.830 \times 10^{-5}$ Pa.s regardless of the atmospheric pressure. The density $\rho$ is given as:

$$\rho = \frac{1.293}{1 + 0.00367t} \cdot \frac{P}{760} \; (Kg/m^3) \tag{28}$$

Substituting Equation (28) into Equation (27) gives the acceptable pressure range as:

$$P \leqq 2.50 \times 10^3 \times (1 + 0.00367t)/r^2\omega \; (mmHg)$$
$$\leqq 3.33 \times 10^5 \times (1 + 0.00367t)/r^2\omega \; (Pa)$$

Figure 44:
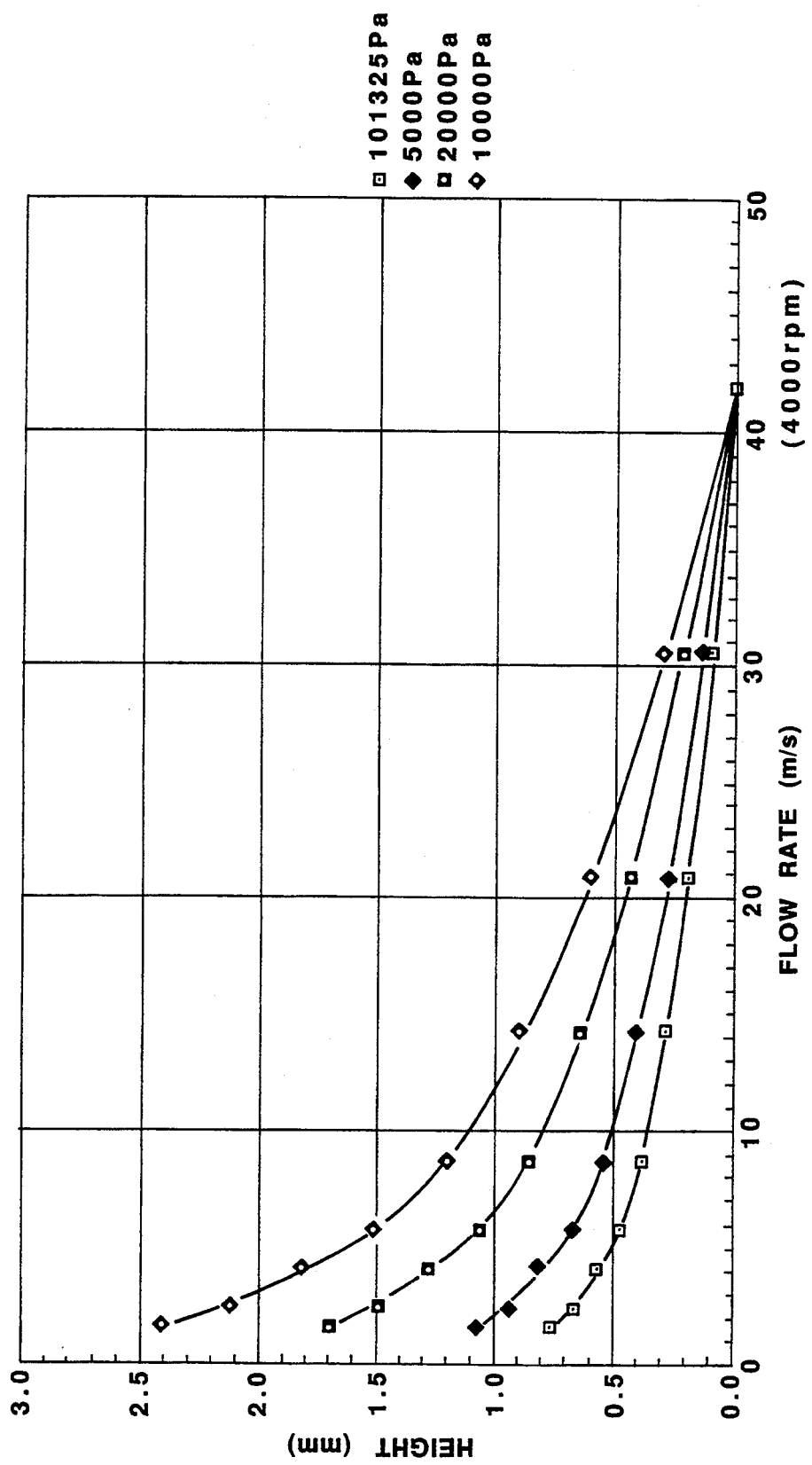
FIG. 44 is a graph of height versus flow rate.
Figure 45:
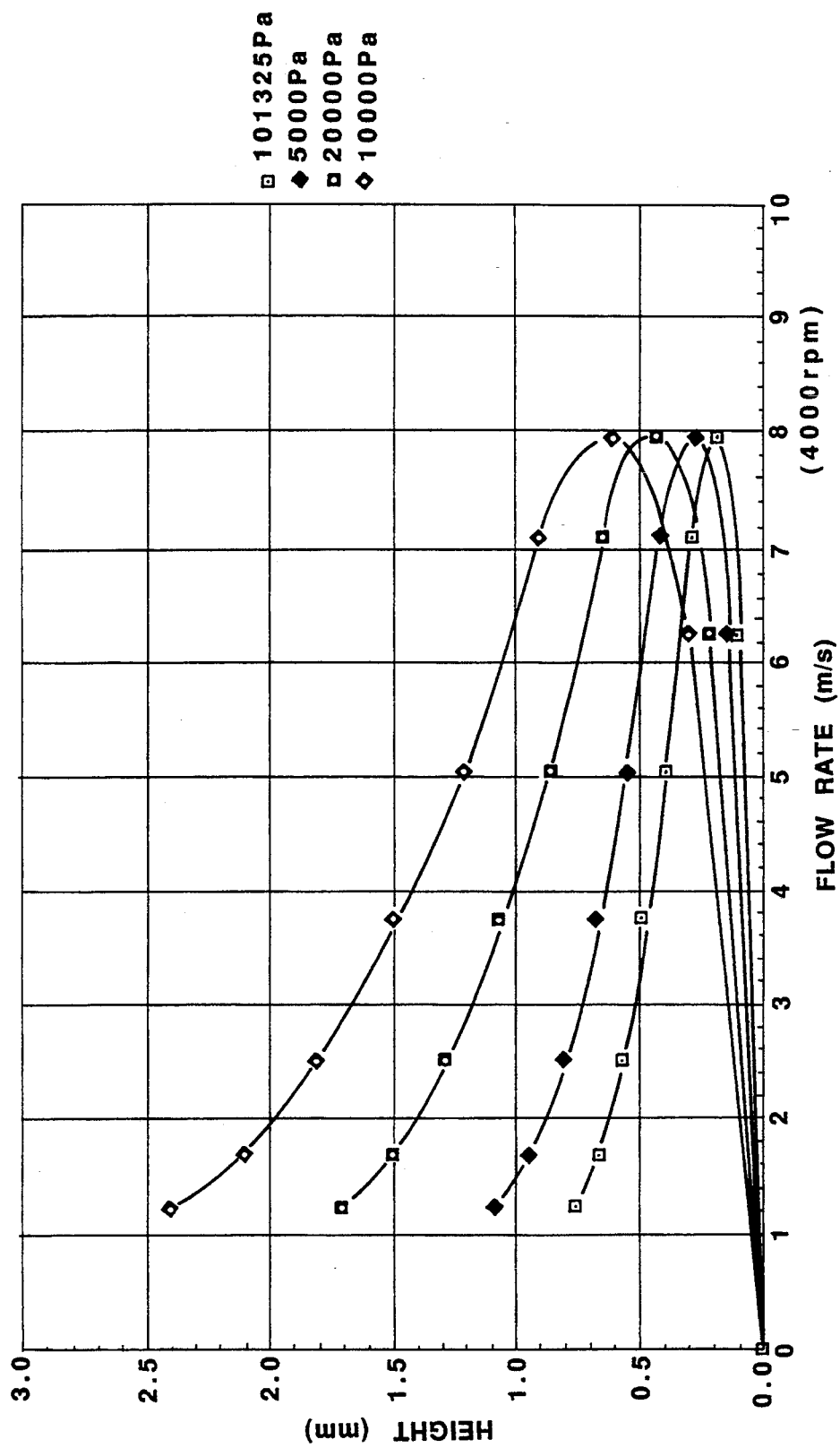
FIG. 45 is a graph of height versus flow rate.

In order to control the pressure where the spin coating is performed, the wafer and disc plate are placed in a pressure chamber. Preferably, the volume of the pressure chamber is as little as possible. The required pressure chamber volume is calculated as follows: Von Karman and Cochran methods can be used to calculate the velocity distribution of the fluid flows produced over the wafer due to its rotation. The calculated results are shown in FIGS. 44 and 45. FIG. 44 relates to the fluid velocities in the direction of the periphery of a wafer having a diameter of 8 inches. The fluid (gas) held in contact with the wafer moves at the same velocity as the wafer. The fluid velocity decreases at a high rate as going away from the wafer. This rate is dependent on the atmospheric pressure. The greater the atmospheric pressure, the smaller the rate at which the fluid velocity increases. For example, the fluid velocity decreases to 2.0 m/s at a height of 0.7 mm above the wafer at 101325 Pa (1 atm), whereas the fluid velocity decreases to 2.0 m/s at a height of 2.4 mm above the wafer at 10000 Pa (about 0.1 atm).

FIG. 45 relates to the fluid velocities in the direction of the radius of the wafer. The fluid (gas) is accelerated due to the centrifugal force acting thereon. The degree to which the fluid is accelerated is dependent on the atmospheric pressure. For example, at 101325 Pa (1 atm), the fluid velocity is at maximum (7.9 m/s) at a height of 0.2 mm above the wafer and it decreases to 1 m/s at a height of 0.8 mm above the wafer. At 10000 Pa (about 0.1 atm), the fluid velocity is at maximum at a height of 0.6 mm above the wafer and it decreases to 1 m/s at a height of 2 mm or more above the wafer. It is, therefore, apparent that the fluid flows occur at a height of 2 mm or less above the wafer. The atmospheric pressure required in practice is 10000 Pa (0.1 atm) and the zone where the pressure should be reduced is at a height of about 2 mm above the wafer.

For a rotating disc plate, the Reynolds number is defined as:

$$Re = \rho r^2 \omega / \eta = r^2 \omega / \upsilon \tag{29}$$

where r is the distance from the center of rotation of the disc plate, $\eta$ is the viscosity coefficient, $\upsilon$ is the kinematic viscosity coefficient of the atmosphere, and $\omega$ is the speed of rotation of the disc plate. The air viscosity coefficient η changes with changes in the ambient temperature. The air viscosity coefficient η is given as:

$$\eta = \eta_0 - 4.83 \times 10^{-8} (23-t)(Pa, s) \quad (30)$$

where $\eta_0$ is the air viscosity coefficient at 23° C. The air density ρ changes with ambient temperature changes. The density ρ is given as:

$$\rho = \frac{1.293}{1 + 0.00367t} \ (Kg/m^3) \quad (31)$$

Figure 46:
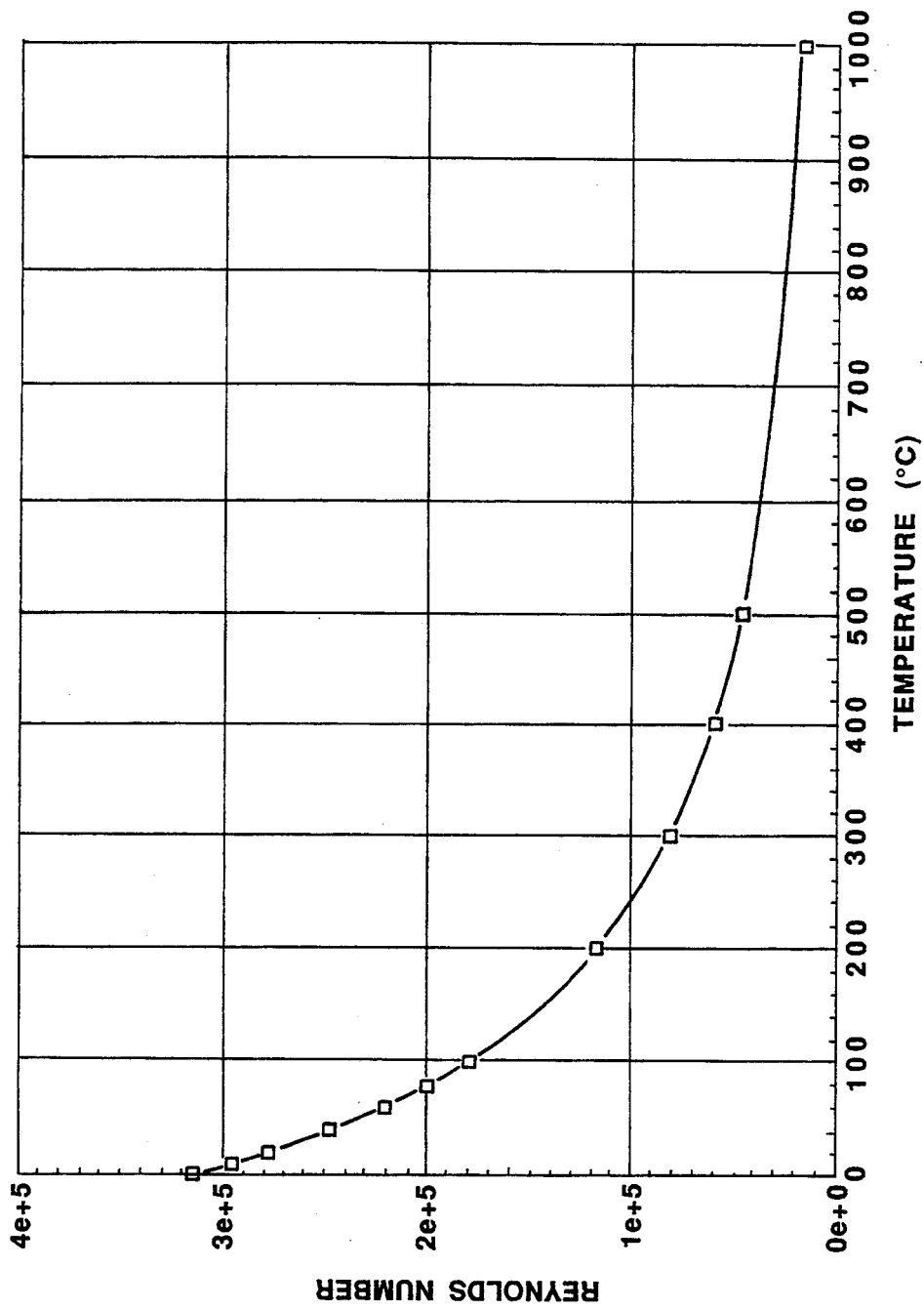
FIG. 46 is a graph of Reynolds number versus temperature.

The relationship between the Reynolds number and the ambient temperature is determined from Equations (29), (30) and (31). This relationship is shown in FIG. 46 which relates to an 8 inch wafer rotated at 4000 rpm. As can be seen from FIG. 46, the Reynolds number decreases as the ambient temperature decreases.

Figure 47:
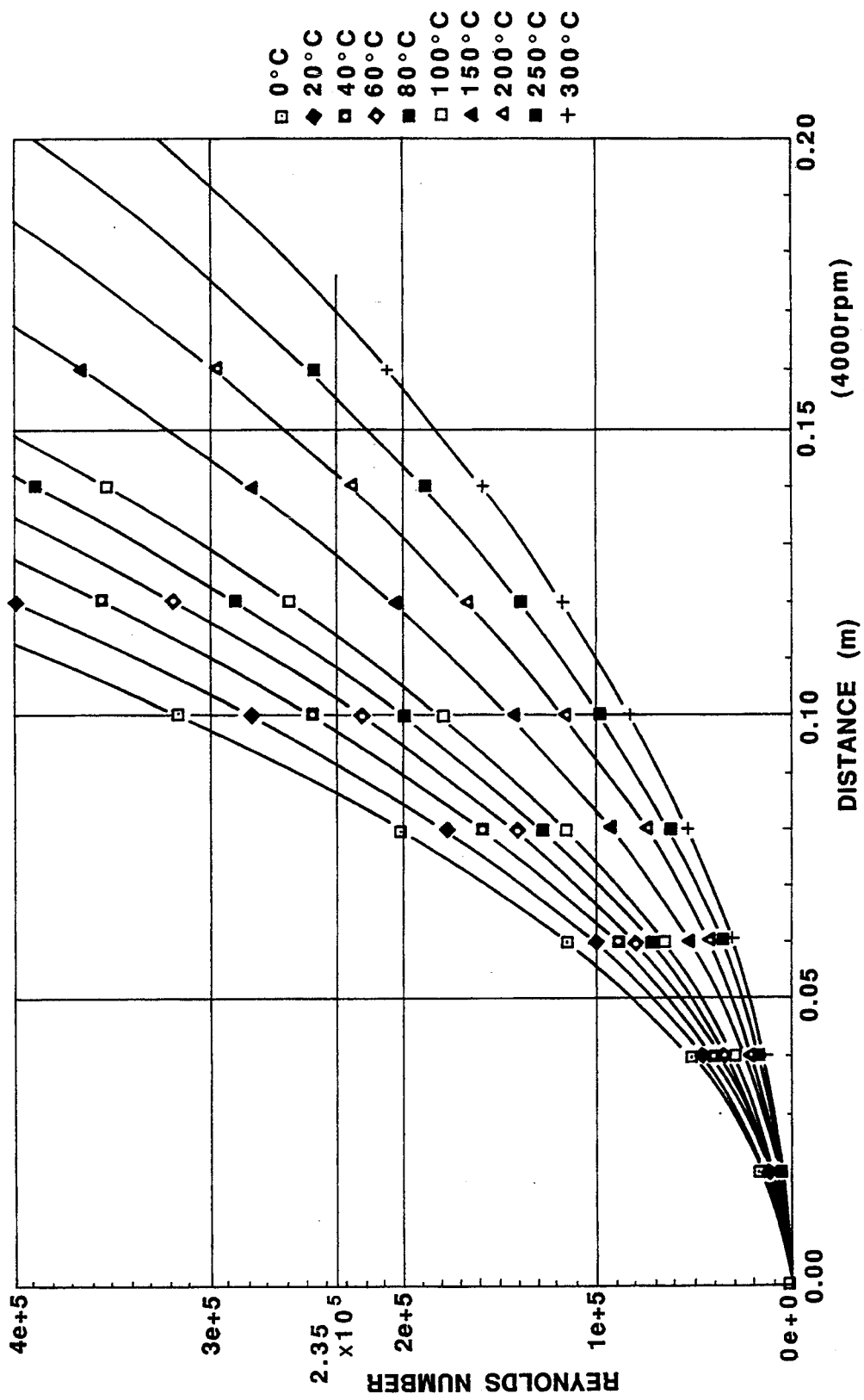
FIG. 47 is a graph of Reynolds number versus distance.
Figure 48:
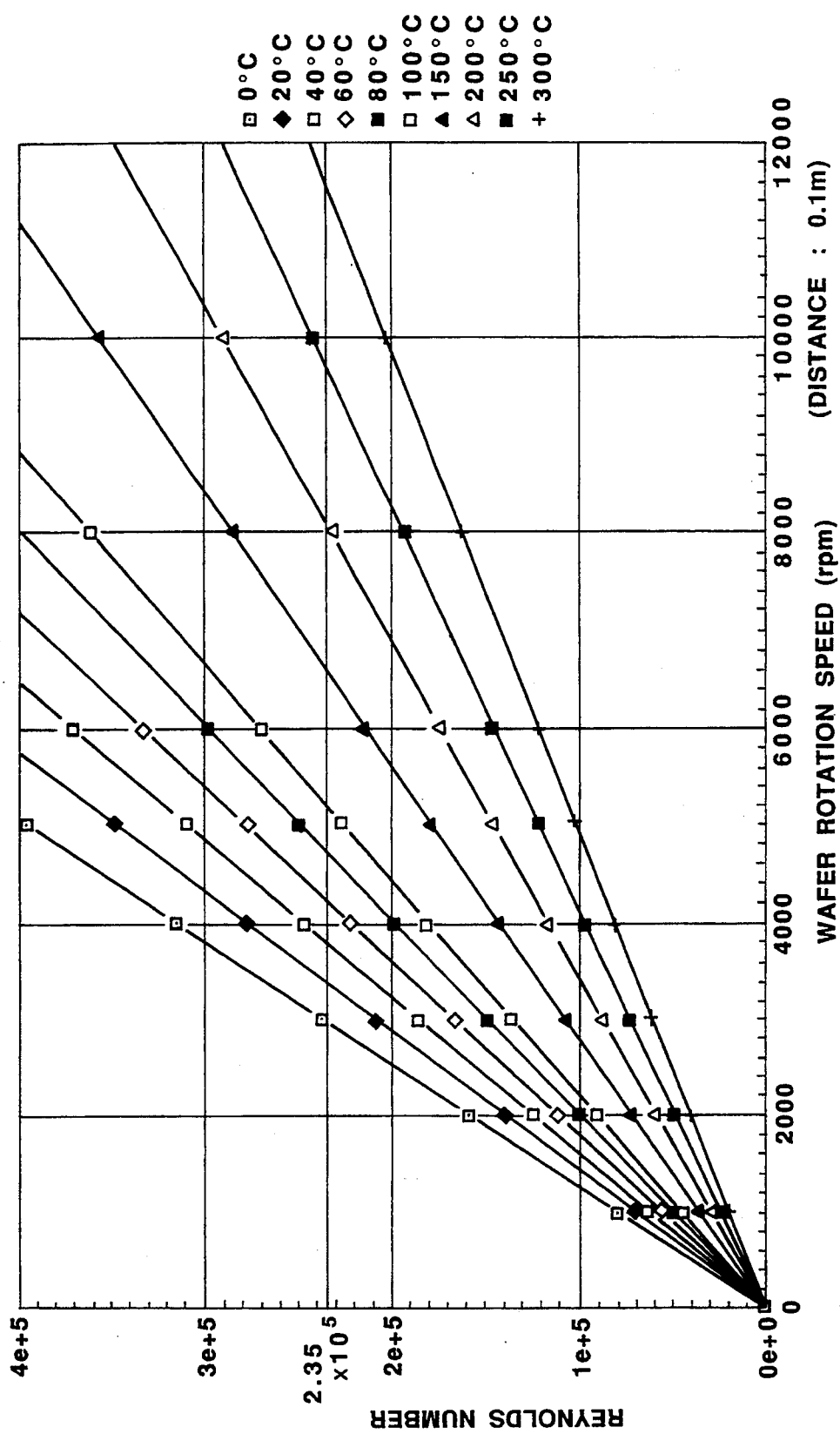
FIG. 48 is a graph of Reynolds number versus wafer rotation speed.

FIG. 47 shows the relationship between the Reynolds number and the wafer diameter, that is, the distance from the center of rotation of the wafer, for different temperatures. The speed of rotation of the wafer is at 4000 rpm. It can be seen from FIG. 47, spin coating is possible for an 8 inch wafer rotated at 4000 rpm if the temperature is increased to 60° C. FIG. 48 shows the relationship between the Reynolds number and the wafer rotation speed for different pressures. The diameter of the wafer is 8 inches. It can be seen from FIG. 48 that spin coating is possible at a speed of 5000 rpm or more if the temperature is increased to 100° C. and at a speed of 10000 rpm or more if the temperature is increased to 250 ° C.

No turbulent flow will occur if the Reynolds number is $2.35 \times 10^5$ or less. The Reynolds number is given as:

$$Re = \rho r^2 \omega / \eta = r^2 \omega / v \quad (32)$$

where r is the distance from the center of rotation of the wafer, η is the viscosity coefficient, v is the kinematic viscosity coefficient of the atmosphere in which the resist is coated, and ω is the speed of rotation of the wafer. The required range of the kinematic viscosity coefficient η of the gas which provides the atmosphere where the spin coating is performed is obtained from Equation (32) as:

$$v = \eta/\rho \geq r^2\omega/Re \quad (33)$$
$$\geq r^2\omega/2.35 \times 10^5$$

The kinematic viscosity coefficient η changes with temperature changes and it is calculated as:

$$\eta = \eta_0 - 4.83 \times 10^{-8} (23-t) \ (Pa.s) \quad (34)$$

wherein $\eta_0$ is the air viscosity coefficient at 23° C. The air density ρ changes with ambient temperature changes. The density ρ is given as:

$$\rho = \frac{1.293}{1 + 0.00367t} \ (Kg/m^3) \quad (35)$$

Substituting Equations (34) and (35) into Equation (33) gives $$v = \frac{\eta}{\rho} = [\eta_0 - 4.83 \times 10^{-8}(23-t)] \frac{1 + 0.00367t}{1.293} \quad (36)$$

Since $\eta_0 = 1.83 \times 10^{-5}$, $$1.371 \times 10^{-10}t^2 - 8.614 \times 10^{-8}t - \quad (37)$$
$$1.329 \times 10^{-5} + \frac{r^2\omega}{2.35 \times 10^5} \leq 0$$

Equation (37) is solved to determine the temperature range as:

$$t \geq \sqrt{(1800 + 31038 r^2\omega)} - 314.2 \ (°C.) \quad (38)$$

For example, the ambient temperature may be set at 48.9° C. or more if spin coating is performed for an 8 inch wafer rotated at 4000 rpm.

Figure 49:
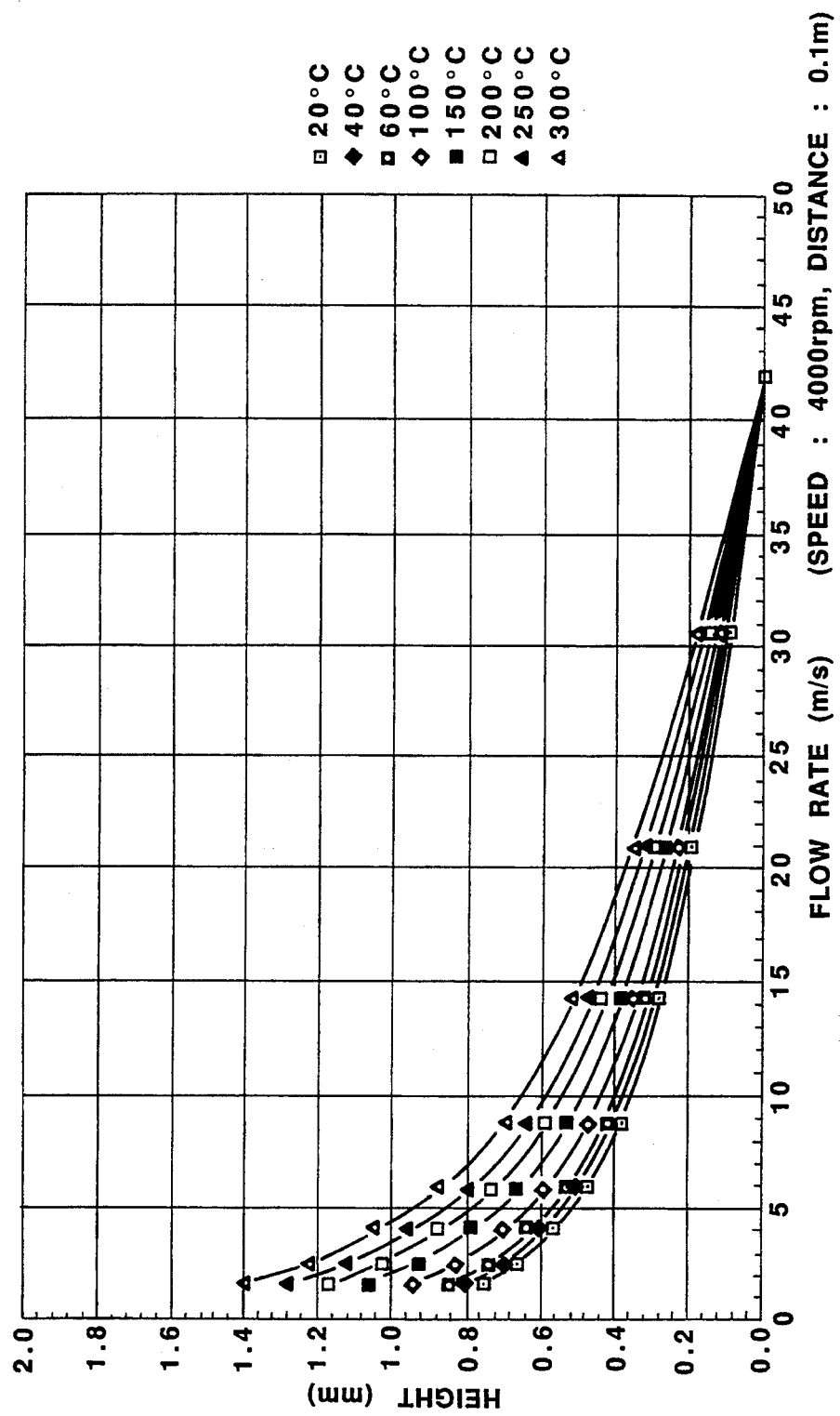
FIG. 49 is a graph of height versus flow rate.
Figure 50:
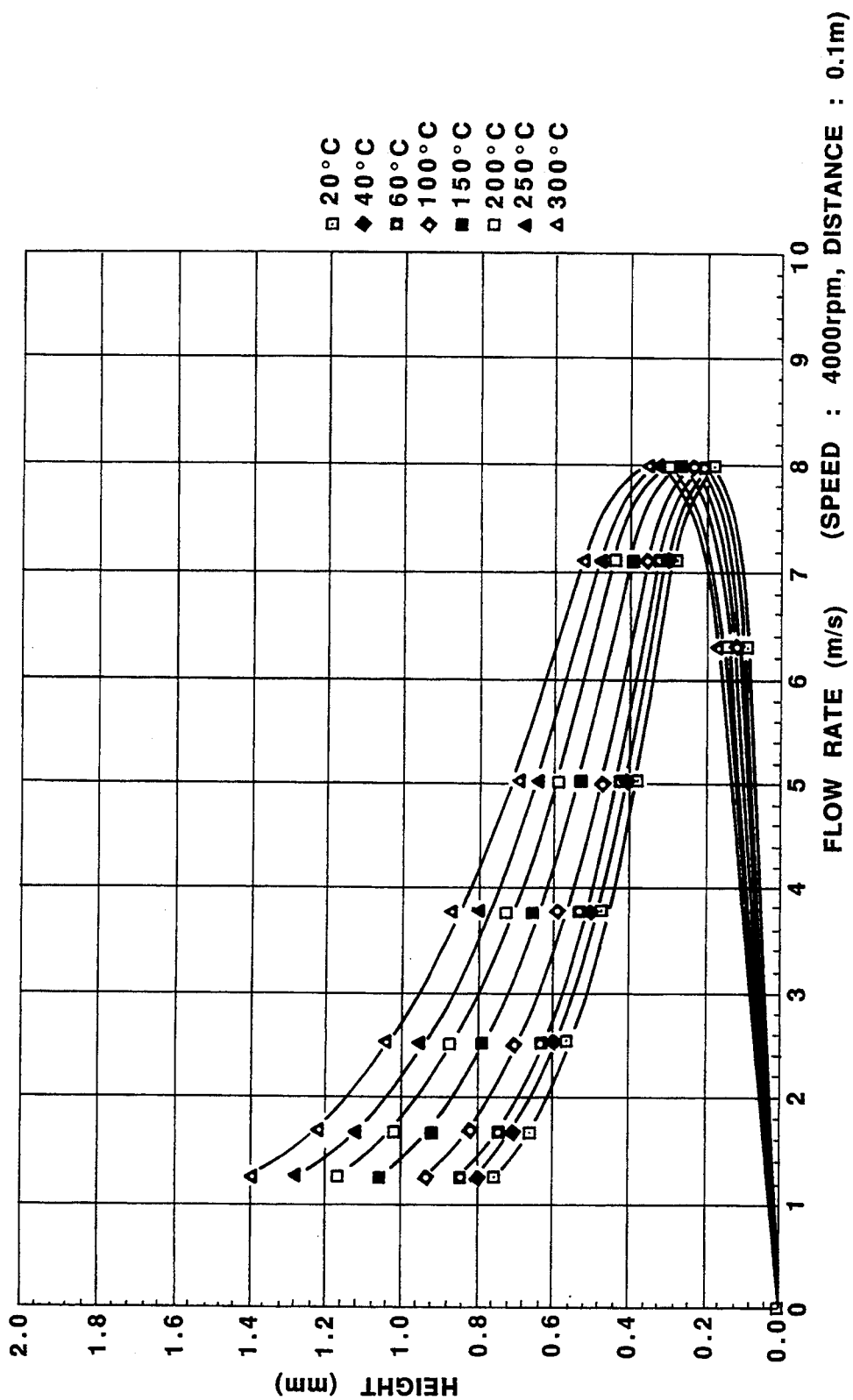
FIG. 50 is a graph of height versus flow rate.

Preferably, the volume of the pressure chamber is as little as possible. The required pressure chamber volume is calculated as follows: Von Karman and Cochran methods can be used to calculate the velocity distribution of the fluid flows produced over the wafer due to its rotation. The calculated results are shown in FIGS. 49 and 50. FIG. 49 relates to the fluid velocities in the direction of the periphery of a wafer having a diameter of 8 inches. The fluid (gas) held in contact with the wafer moves at the same velocity as the wafer. The fluid velocity decreases at a high rate as going away from the wafer. This rate is dependent on the ambient temperature. The greater the ambient temperature, the smaller the rate at which the fluid velocity increases. For example, the fluid velocity decreases to 0.2 m/s at a height of 0.7 mm above the wafer at 20° C., whereas the fluid velocity decreases to 0.2 m/s at a height of 1.4 mm above the wafer at 300°

FIG. 50 relates to the fluid velocities in the direction of the radius of the wafer. The fluid (gas) is accelerated due to the centrifugal force acting thereon. The degree to which the fluid is accelerated is dependent on the ambient temperature. For example, at 20° C., the fluid velocity is at maximum (7.9 m/s) at a height of 0.2 mm above the wafer and it decreases to 1 m/s at a height of 0.8 mm above the wafer. At 300° C., the fluid velocity is at maximum at a height of 0.35 mm above the wafer and it decreases to 1 m/s at a height of 1.4 mm or more above the wafer. It is, therefore, apparent that the fluid flows occur at a height of 1.4 mm or less above the wafer at an ambient temperature of 300° C. The ambient temperature required in practice is about 300° C. and the zone where the temperature should be increased is at a height of about 2 mm above the wafer.

Figure 51:
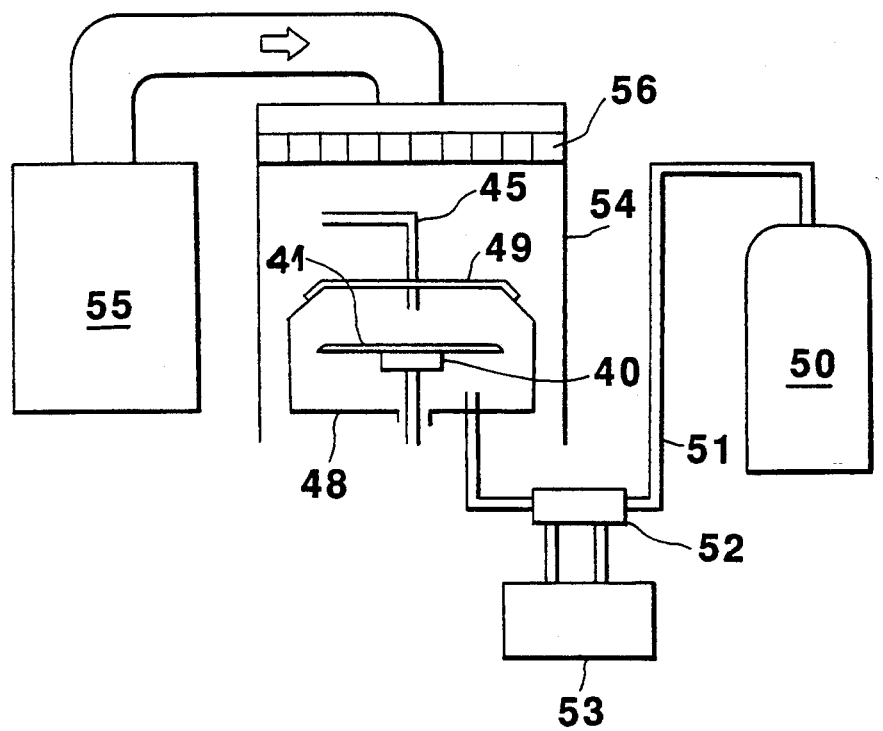
FIG. 51 is a schematic diagram showing a modified form of the spin coating apparatus of the invention.

FIG. 51 shows a spin coating apparatus used in the third embodiment of the invention. A wafer 41 is retained in a horizontal position by means of a wafer chuck 40. The wafer 41 is placed in a vessel 48 into which a resist nozzle 45 extends. A cover 49 is used to close the vessel 48 to form a sealed pressure chamber in which the wafer 41 is placed. The pressure chamber is charged with a gas introduced through a conduit 51 from a gas bomb or source 50. The conduit 51 extends through a heat exchanger 52 connected to a heat controller 53 for controlling the temperature of the gas to be introduced into the vessel 48. The vessel 48 is covered by a hood 54. An air conditioner 55 is connected to the hood 54 for controlling the temperature and humidity of the atmosphere in which the spin coating operation is performed. The numeral 56 designates a paper filter.

EXAMPLE 22

The diameter of the wafer 41 was 8 inches. The gas introduced into the vessel 48 was Ne. The Ne gas was heated at 23° C. The temperature and humidity of the atmosphere were controlled at 23° C. and 40%. The resist coated on the wafer 41 was TSMR-8900 (a trademark of Tokyo Applied Chemistry, Ltd.). No turbulent flow occurred even when the wafer 41 was rotated at a speed of 8000 rpm. The variance width (Range) was 4.0 nm.

EXAMPLE 23

The diameter of the wafer 41 was 8 inches. The gas introduced into the vessel 48 was He. The He gas was heated at 23° C. The temperature and humidity of the atmosphere were controlled at 23° C. and 40%. The resist coated on the wafer 41 was TSMR-8900 (a trademark of Tokyo Applied Chemistry, Ltd.). No turbulent flow occurred even when the wafer 41 was rotated at a speed of 25000 rpm. The variance width (Range) was 3.5 nm.

EXAMPLE 24

The diameter of the wafer 41 was 8 inches. The gas introduced into the vessel 48 was a mixture of Ne and He (Ne:He=1:2). The gas mixture was heated at 23° C. The temperature and humidity of the atmosphere were controlled at 23° C. and 40%. The resist coated on the wafer 41 was TSMR-8900 (a trademark of Tokyo Applied Chemistry, Ltd. ). No turbulent flow occurred even when the wafer 41 was rotated a t a speed of 15000 rpm. The variance width (Range) was 3.8 nm.

Figure 52:
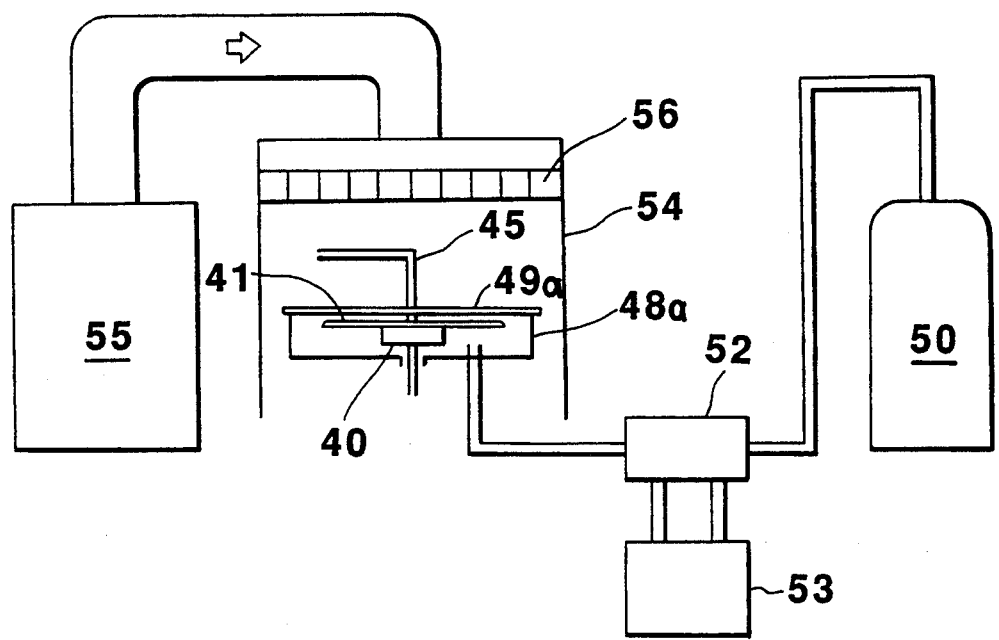
FIG. 52 is a schematic diagram showing a modified form of the spin coating apparatus of the invention.

Referring to FIG. 52, there is shown a modified form of the spin coating apparatus used in the third embodiment of the invention. In this modification, the cover 49*a* is positioned at a height of 2 mm above the wafer 41. This structure is effective to minimize the volume of the vessel 48*a* and, thus, minimize the required amount of the expensive gas introduced into the vessel 48*a*.

EXAMPLE 25

The diameter of the wafer 41 was 8 inches. The gas introduced into the vessel 48*a* was Ne. The Ne gas was heated at 23° C. The temperature and humidity of the atmosphere were controlled at 23° C. and 40%. The resist coated on the wafer 41 was TSMR-8900 (a trademark of Tokyo Applied Chemistry, Ltd.). No turbulent flow occurred even when the wafer 41 was rotated at a speed of 8000 rpm. The variance width (Range) was 4.0 nm. The required amount of the Ne gas was reduced from 2 l to 0.71 l.

Figure 53:
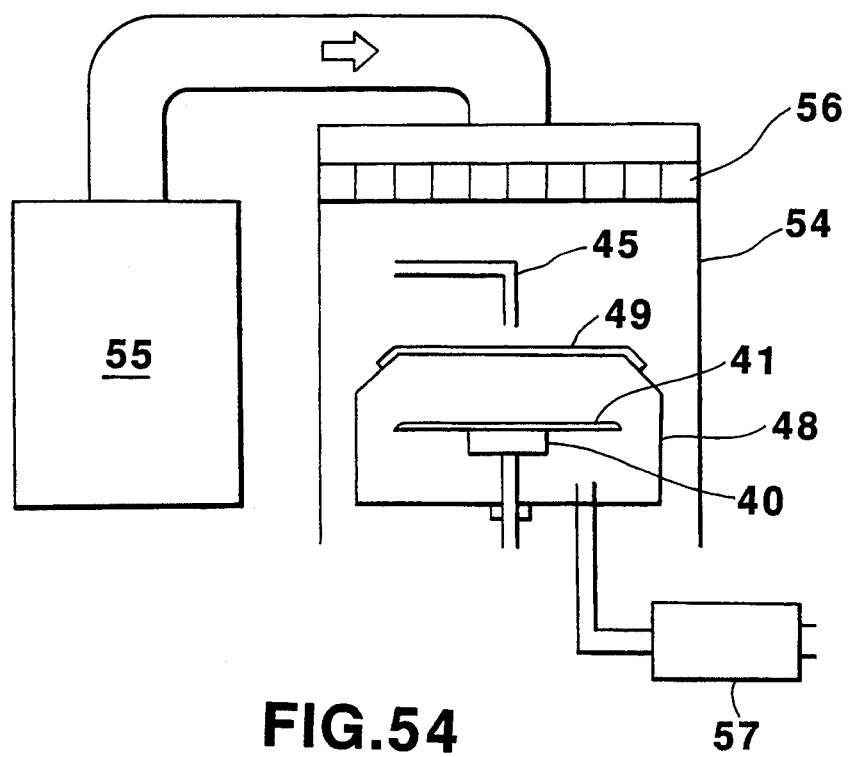
FIG. 53 is a schematic diagram showing a modified form of the spin coating apparatus of the invention.

Referring to FIG. 53, there is shown another modified form of the spin coating apparatus used in the third embodiment of the invention. A wafer 41 is retained in a horizontal position by means of a wafer chuck 40. The wafer 41 is placed in a vessel 48 into which a resist nozzle 45 extends. A cover 49 is used, after a required amount of resist is discharged through a resist nozzle 45 onto the wafer 41, to close the vessel 48 to form a sealed pressure chamber in which the wafer 41 is placed. An ultrasonic wave is used to eliminate the air included in the resist. A rotary pump 57 is connected to the pressure chamber for decreasing the pressure in the vessel 48. The vessel 48 is covered by a hood 54. An air conditioner 55 is connected to the hood 54 for controlling the temperature and humidity of the atmosphere in which the spin coating operation is performed. The numeral 56 designates a paper filter.

EXAMPLE 26

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd.). The output power of the rotary pump 57 was 500 W. The pressure in the vessel 48 was reduced to 10000 Pa (about 0.1 atm) in about 3 seconds. No turbulent flow occurred even when the wafer 41 was rotated at a speed of 12000 rpm. The variance width (Range) was 4.0 nm.

EXAMPLE 27

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd.). The pressure in the vessel 48 was set at 5000 Pa (about 0.5 atm). The time required to reduce the vessel pressure to a desired value was reduced from 3 seconds to 1 second. No turbulent flow occurred even when the wafer 41 was rotated at a speed of 6500 rpm. The variance width (Range) was 4.5 nm.

Figure 54:
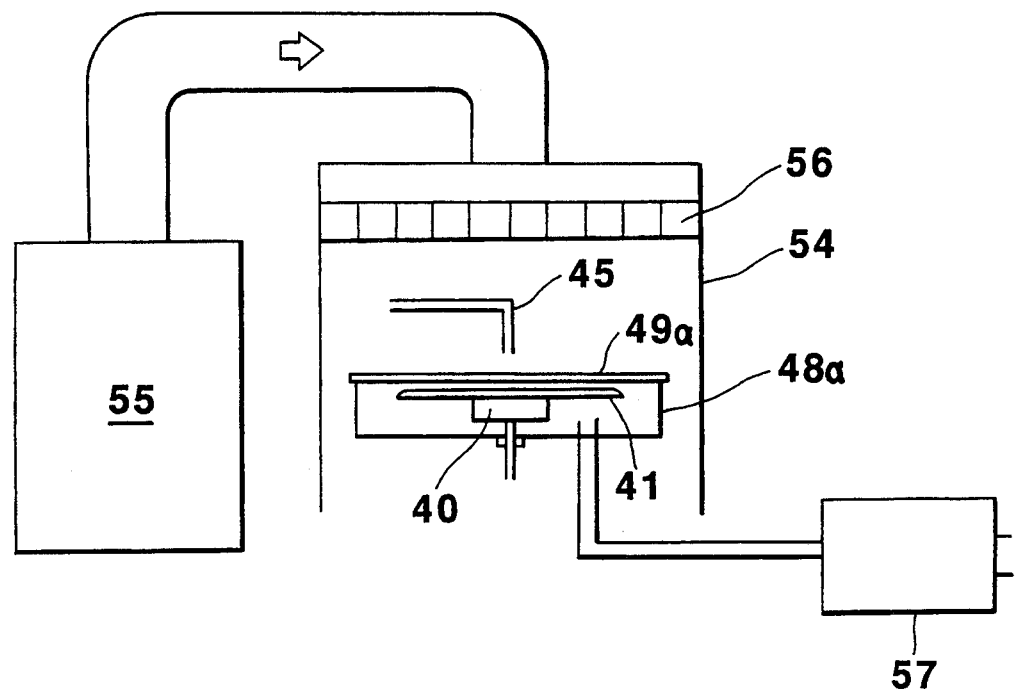
FIG. 54 is a schematic diagram showing a modified form of the spin coating apparatus of the invention.

Referring to FIG. 54, there is shown another modified form of the spin coating apparatus used in the third embodiment of the invention. In this modification, the cover 49*a* is positioned at a height of 2 mm above the wafer 41. This structure is effective to minimize the volume of the vessel 48*a* and, thus, minimize the time required to reduce the vessel pressure to a desired value.

EXAMPLE 28

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd.). The time required to reduce the vessel pressure to 10000 Pa was reduced to 0.5 seconds. No turbulent flow occurred even when the wafer 41 was rotated at a speed of 12000 rpm. The variance width (Range) was 4.0 nm.

EXAMPLE 29

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd.). The time required to reduce the vessel pressure to 5000 Pa was reduced to 0.1 seconds. No turbulent flow occurred even when the wafer 41 was rotated at a speed of 6500 rpm. The variance width (Range) was 4.5 nm.

Figure 55:
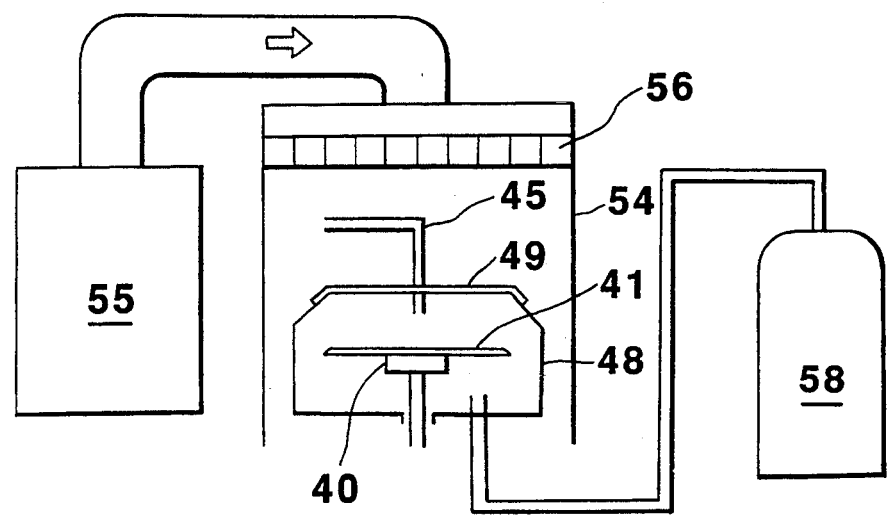
FIG. 55 is a schematic diagram showing a modified form of the spin coating apparatus of the invention.

Referring to FIG. 55, there is shown another modified form of the spin coating apparatus used in the third embodiment of the invention. A wafer 41 is retained in a horizontal position by means of a wafer chuck 40. The wafer 41 is placed in a vessel 48 into which a resist nozzle 45 extends. A cover 49 is used to close the vessel 48 to form a sealed pressure chamber in which the wafer 41 is placed. A resist is discharged through a resist nozzle 45 onto the wafer 41. An ultrasonic wave is used to eliminate the air included in the resist. The vessel 48 is charged with heated air through a heater 58. The vessel 48 is covered by a hood 54. An air conditioner 55 is connected to the hood 54 for controlling the temperature and humidity of the atmosphere in which the spin coating operation is performed. The numeral 56 designates a paper filter.

EXAMPLE 30

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd. ). The output power of the heater 58 was 1 kW. The temperature in the vessel 48 was increased to 300° in about 3 seconds. No turbulent flow occurred even when the wafer 41 was rotated at a speed of 10000 rpm. The variance width (Range) was 4.0

EXAMPLE 31

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd.). The temperature in the vessel 48 was set at 60° C. The time required to increase the vessel temperature to a desired value was reduced from 3 seconds to 1 second. No turbulent flow occurred even when the wafer 41 was rotated at a speed of 4000 rpm. The variance width (Range) was 4.5 nm.

Figure 56:
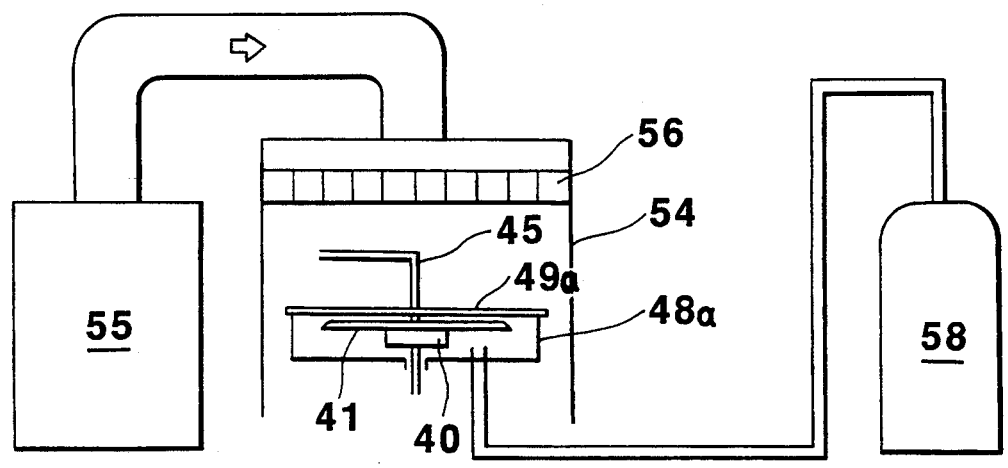
FIG. 56 is a schematic diagram showing a modified form of the spin coating apparatus of the invention.

Referring to FIG. 56, there is shown another modified form of the spin coating apparatus used in the third embodiment of the invention. In this modification, the cover 49a is positioned at a height of 2 mm above the wafer 41. This structure is effective to minimize the volume of the vessel 48 and, thus, minimize the time required to increase the vessel temperature to a desired value.

EXAMPLE 32

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd. ). The time required to increase the vessel temperature to 300° C. was reduced to 0.5 seconds. No turbulent flow occurred even when the wafer 41 was rotated at a speed of 10000 rpm. The variance width (Range) was 4.0 nm.

EXAMPLE 33

The diameter of the wafer 41 was 8 inches. The temperature and humidity of the atmosphere were controlled at 23° C. and 40%. The resist coated on the wafer 41 was TSMR-8900 (a trademark of Tokyo Applied Chemistry, Ltd.). The vessel temperature was set at 60° C. The time required to reduce the vessel pressure to the desired value (60° C.) was reduced to 0.1 seconds. No turbulent flow occurred even when the wafer 41 was rotated at a speed of 4000 rpm. The variance width (Range) was 4.5 nm.

While this invention has been described in conjunction with specific embodiments thereof, it is evident that many alternatives, modifications and variations will be apparent to those skilled in the art. Accordingly, it is intended to embrace all alternatives, modifications and variations that fall within the scope of the appended claims.

What is claimed is:

1. A spin coating method for rotating a substrate having a liquid material placed thereon to coat the liquid material over the substrate, the method comprising the steps of supporting the substrate, dropping the liquid material on the substrate, rotating the substrate about an axis extending through the center of the substrate and rotating a plate member in the same direction as the subtrate, said plate member being positioned at a height above the substrate to minimize the growth of the fluid flows produced above the substrate due to rotation of the substrate.

2. The spin coating method as claimed in claim 1, wherein the liquid material is photo resist.

3. The spin coating method as claimed in claim 1, further comprising the step of controlling the angular velocity w1 of the substrate and the angular velocity w2 of the plate member to satisfy the following condition:

$$|w1-w2| \leq (v/r_0^2) \times 2.35 \times 10^5$$

wherein $r_0$ is the radius of the substrate and $v$ is the kinematic viscosity coefficient of the atmosphere around the substrate.

4. A spin coating apparatus for rotating a substrate having a liquid material placed thereon to coat the liquid material over the substrate, the apparatus comprising means for supporting the substrate and rotating the substrate about an axis extending through the center of the substrate, a nozzle for dropping the liquid material onto the substrate, a plate member positioned at a height above the substrate to minimize the growth of the fluid flows produced above the substrate due to rotation of the substrate and means for rotating the plate member in the same direction as the substrate.

5. The spin coating apparatus as claimed in claim 4, wherein the plate member is positioned in spaced-parallel relation to the substrate.

6. The spin coating apparatus as claimed in claim 4, wherein the plate member is of a disc shape.

7. The spin coating apparatus as claimed in claim 4, further comprising means for controlling the angular velocity w1 of the substrate and the angular velocity w2 of the plate member to satisfy the following condition:

$$|W1-w2| \leq (v/r_0^2) \times 2.35 \times 10^5$$

wherein $r_0$ is the radius of the substrate and $v$ is the kinematic viscosity coefficient of the atmosphere surrounding the substrate.

8. The spin coating apparatus as claimed in claim 4, further comprising moving means for moving the plate member between first and second positions, the moving means retaining the plate member in the first position above the substrate during a spin coating operation and moving the plate member from the first position to the second positions when the spin costing operation is completed.

9. The spin coating apparatus as claimed in claim 4, wherein the plate member is of a ring shape.

10. The spin coating apparatus as claimed in claim 9, wherein the ring shaped plate member has a width L calculated as:

$$L = r_0 - \sqrt{Re \cdot v/w}$$

where $r_0$ is the radius of the substrate, Re is the Reynolds number, $v$ is the kinematic viscosity coefficient of the atmosphere around the substrate, and w is the angular velocity of the substrate.

11. A spin coating method for rotating a substrate having a liquid material placed thereon to coat the liquid material over the substrate, the method comprising the steps of supporting the substrate, dropping the liquid material on the substrate, rotating the substrate about an axis extending through the center of the substrate, and positioning a plate member at a height above the substrate to minimize the growth of the fluid flows produced above the substrate due to rotation of the substrate, the plate member on a surface facing the substrate having a number of grooves for introduction of the fluid flows.

12. The spin coating method as claimed in claim 11, wherein the plate member is rotated in the same direction as the substrate.

13. The spin coating method as claimed in claim 11, wherein the liquid material is a photo resist.

14. A spin coating apparatus for rotating a substrate having a liquid material placed thereon to coat the liquid material over the substrate, the apparatus comprising means for supporting the substrate, means for dropping the liquid material on the substrate, means for rotating the substrate about an axis extending through the center of the substrate, and a plate member positioned at a height above the substrate to minimize the growth of the fluid flows produced above the substrate due to rotation of the substrate, the plate member an a surface facing the substrate being a number of grooves for introduction of the fluid flows.

15. The spin coating apparatus as claimed in claim 14, further comprising means for rotating the plate member in the same direction as the substrate.

16. The spin coating apparatus as claimed in claim 15, wherein the plate member is positioned substantially in spaced-parallel relation to the substrate.

17. The spin coating apparatus as claimed in claim 15, wherein the grooves are circular grooves coaxial about the center of rotation of the plate member.

18. The spin coating apparatus as claimed in claim 15, wherein the grooves are spiral grooves extending from the center of rotation of the plate member.

19. The spin coating apparatus as claimed in claim 18, wherein the grooves are formed according to loci with respect to a distance from a surface of the plate member.

20. A spin coating method for rotating a substrate having a liquid material placed thereon to coat the liquid material over the substrate, the method comprising the steps of supporting the substrate, dropping the liquid material on the substrate, providing an atmosphere of a gas in which spin coating is to be performed, and rotating the substrate about an axis extending through the center of the substrate with a plate member positioned at a height above the substrate to minimize the growth of the fluid flows produced above the substrate due to rotation of the substrate, the gas having a kinematic viscosity coefficient $v1$ defined as:

$$v1 \geq r^2 \cdot w / 2.35 \times 10^{-5}$$

where r is the radius of the substrate and w is the angular velocity of the substrate.

21. A spin coating apparatus for rotating a substrate having a liquid material placed thereon to coat the liquid material over the substrate, the apparatus comprising means for supporting the substrate and rotating the substrate about an axis extending through the center of the substrate, a nozzle for dropping the liquid material onto the substrate, means including a plate member positioned at a height above the substrate to minimize the growth of the fluid flows produced above the substrate due to rotation of the substrate, a chamber for containing the substrate, means for charging the chamber with a gas.

22. A spin coating method for rotating a substrate having a liquid material placed thereon to coat the liquid material over the substrate, the method comprising the steps of supporting the substrate, dropping the liquid material on the substrate, controlling the pressure of the atmosphere of the substrate to a value P, and rotating the substrate about an axis extending through the center of the substrate with a plate member positioned at a height above the substrate to minimize the growth of the fluid flows produced above the substrate due to rotation of the substrate, the pressure P being in the following range:

$$P(\text{mmHg}) \leq 2.50 \times 10^3 \times (1 + 0.00367t)/r^2 w$$

where r is the radius of the substrate and w is the angular velocity of the substrate.

23. A spin coating apparatus for rotating a substrate having a liquid material placed thereon to coat the liquid material over the substrate, the apparatus comprising means for supporting the substrate and rotating the substrate about an axis extending through the center of the substrate, a nozzle for dropping the liquid material onto the substrate, means including a plate member positioned at a height above the substrate to minimize the growth of the fluid flows produced above the substrate due to rotation of the substrate, a chamber for containing the substrate, and means for decreasing the pressure in the chamber to a set value.

24. A spin coating method for rotating a substrate having a liquid material placed thereon to coat the liquid material over the substrate, the method comprising the steps of supporting the substrate, dropping the liquid material on the substrate, controlling the temperature of the atmosphere of the substrate to a value t1, and rotating the substrate about an axis extending through the center of the substrate with a plate member positioned at a height above the substrate to minimize the growth of the fluid flows produced above the substrate due to rotation of the substrate, the temperature t1 being defined as:

$$t1 \, (°C.) \geq \sqrt{1800 + 30000 r^2 w} - 314.2$$

where r is the radius of the substrate and w is the angular velocity of the substrate.

25. A spin coating apparatus for rotating a substrate having a liquid material placed thereon to coat the liquid material over the substrate, the apparatus comprising means for supporting the substrate and rotating the substrate about an axis extending through the center of the substrate, a nozzle for dropping the liquid material onto the substrate, means including a plate member positioned at a height above the substrate to minimize the growth of the fluid flows produced above the substrate due to rotation of the substrate, a chamber for containing the substrate, means for introducing a heated gas into the chamber to control the temperature of the chamber to a set value.

* * * * *